United States Patent
Hama et al.

(10) Patent No.: US 7,189,290 B2
(45) Date of Patent: Mar. 13, 2007

(54) METHOD AND DEVICE FOR CLEANING RAW MATERIAL GAS INTRODUCTION TUBE USED IN CVD FILM FORMING APPARATUS

(75) Inventors: Kenichi Hama, Kawasaki (JP); Tsuyoshi Kage, Kashiwa (JP); Takumi Kobayashi, Singapore (SG); Takeharu Kawabe, Matsudo (JP)

(73) Assignees: Mitsubishi Shoji Plastics Corporation, Tokyo (JP); Youtec Co., Ltd., Nagareyama (JP); Kirin Brewery Company, Limited, Tokyo (JP)

( * ) Notice: Subject to any disclaimer, the term of this patent is extended or adjusted under 35 U.S.C. 154(b) by 29 days.

(21) Appl. No.: 10/511,607

(22) PCT Filed: May 21, 2003

(86) PCT No.: PCT/JP03/06331

§ 371 (c)(1),
(2), (4) Date: Nov. 4, 2004

(87) PCT Pub. No.: WO03/104523

PCT Pub. Date: Dec. 18, 2003

(65) Prior Publication Data

US 2005/0227019 A1    Oct. 13, 2005

(30) Foreign Application Priority Data

Jun. 5, 2002   (JP) .............................. 2002-164151

(51) Int. Cl.
*B08B 5/04* (2006.01)

(52) U.S. Cl. ................... 134/21; 134/22.12; 134/22.18; 134/34; 134/37; 134/198; 118/723 R; 118/723 E; 118/733; 427/569; 427/577

(58) Field of Classification Search ................. 134/21, 134/22.12, 22.18, 34, 37, 198; 118/723 R, 118/723 E, 733; 427/569, 577
See application file for complete search history.

(56) References Cited

U.S. PATENT DOCUMENTS 5,232,511 A * 8/1993 Bergman .................. 134/2
5,711,819 A * 1/1998 Miyasaki ................. 134/11
5,798,139 A * 8/1998 Nagashima et al. ....... 427/237

(Continued)

FOREIGN PATENT DOCUMENTS

JP   08-053117   2/1996

(Continued)

*Primary Examiner*—Bret Chen
(74) *Attorney, Agent, or Firm*—Oblon, Spivak, McClelland, Maier & Neustadt, P.C

(57) ABSTRACT

A method and apparatus for cleaning a source gas introduction pipe, which can prevent strong adhesion of contaminant mainly containing carbon powder on an outer surface of the source gas introduction pipe to easily remove the contaminant in a short period of time. While compressed air is sprayed toward the contaminant, the contaminant removed by the spray of the compressed air is exhausted outside a system of a deposition chamber by suction and exhausting device so that the contaminant is not transferred to sides of the deposition chamber and a plastic container in which a CVD film is formed, in a process for extracting the source gas introduction pipe from the plastic container after the CVD film is formed on an inner surface of the plastic container.

33 Claims, 16 Drawing Sheets

U.S. PATENT DOCUMENTS

| | | |
|---|---|---|
| 5,853,833 A * | 12/1998 | Sudo et al. .............. 428/36.6 |
| 5,944,908 A * | 8/1999 | Jarema et al. .............. 134/2 |
| 6,112,695 A * | 9/2000 | Felts .................... 118/723 E |
| 6,294,226 B1* | 9/2001 | Shimamura ............... 427/577 |
| 6,924,001 B2* | 8/2005 | Hama et al. ............... 427/237 |
| 2003/0219547 A1* | 11/2003 | Arnold et al. ............. 427/569 |
| 2004/0055153 A1* | 3/2004 | Zahradnik et al. ........... 29/846 |
| 2005/0118365 A1* | 6/2005 | Miyazaki et al. .......... 428/34.1 |

FOREIGN PATENT DOCUMENTS

| | | |
|---|---|---|
| JP | 10-226884 | 8/1998 |
| JP | 10-258825 | 9/1998 |
| JP | 2001-335946 | 12/2001 |
| JP | 2002-121667 | 4/2002 |

* cited by examiner

Fig.2
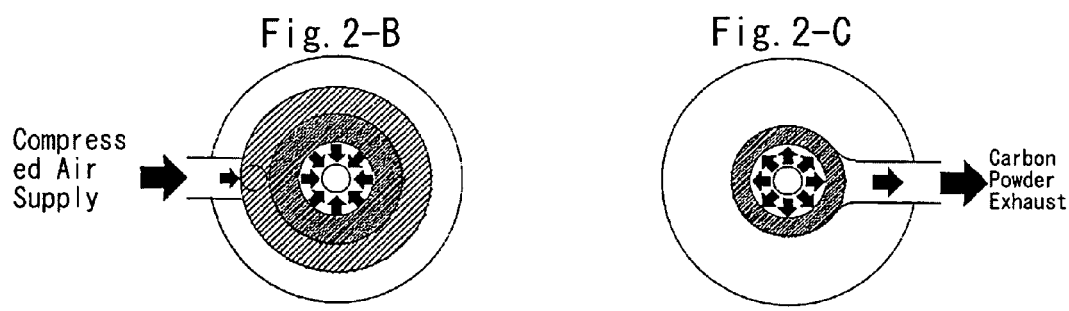
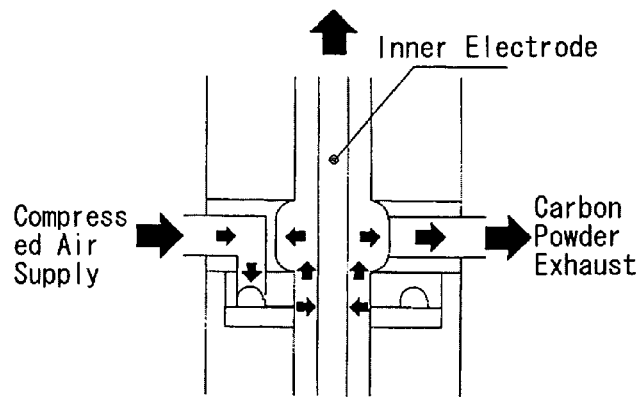

Fig.8
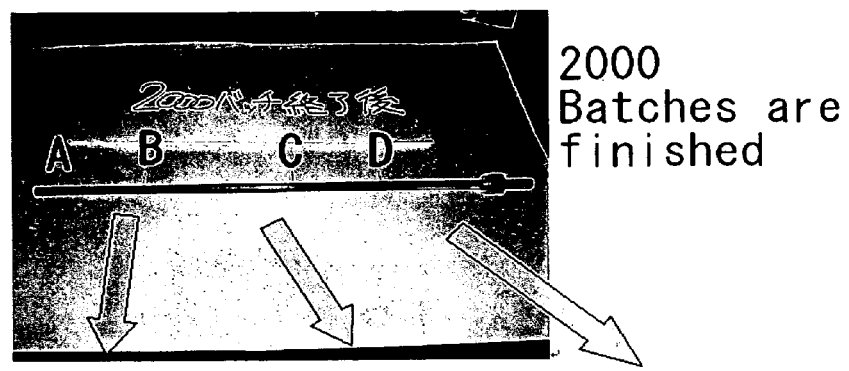
2000 Batches are finished
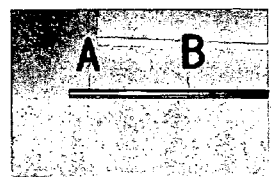
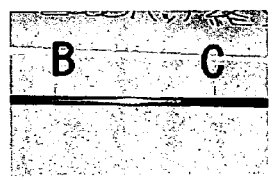
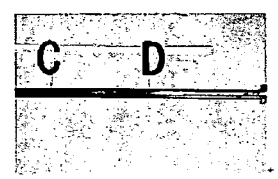
Fig.9　　　　　　　　　　　　Fig.10
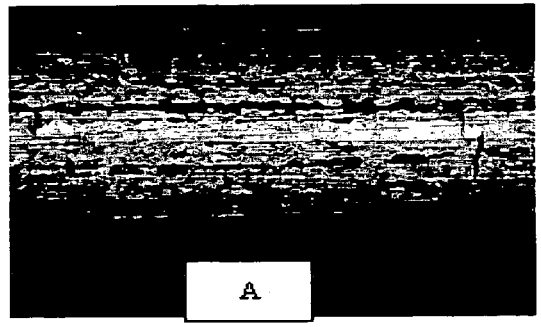
Fig.11　　　　　　　　　　　　Fig.12
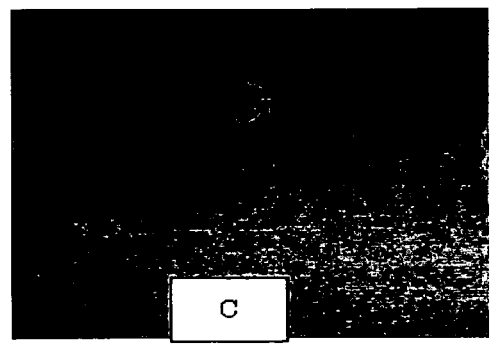
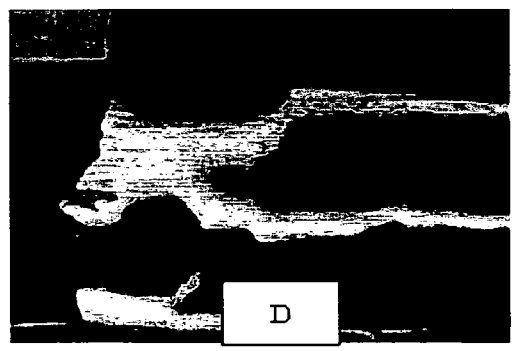

Fig.13
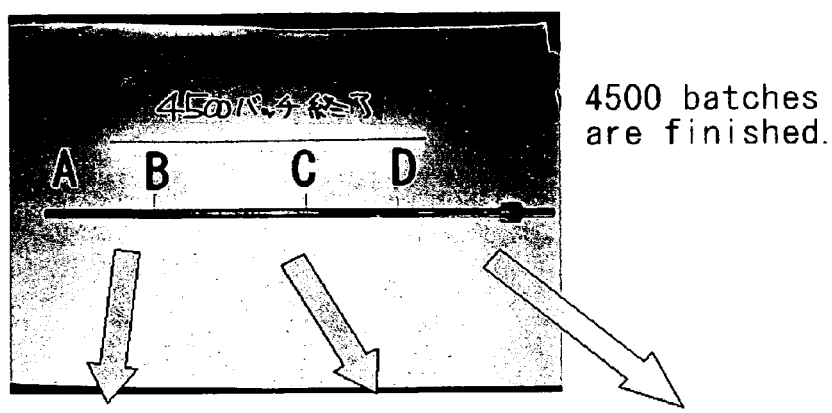
4500 batches are finished.
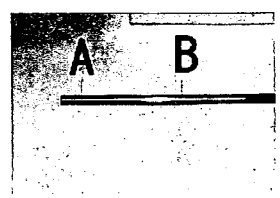
Fig.14
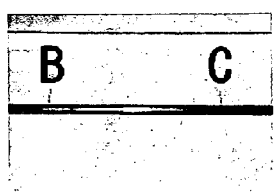
Fig.15
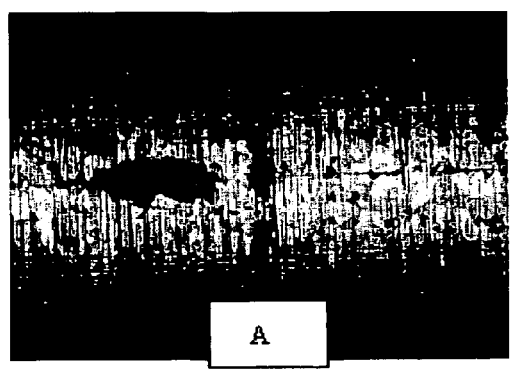
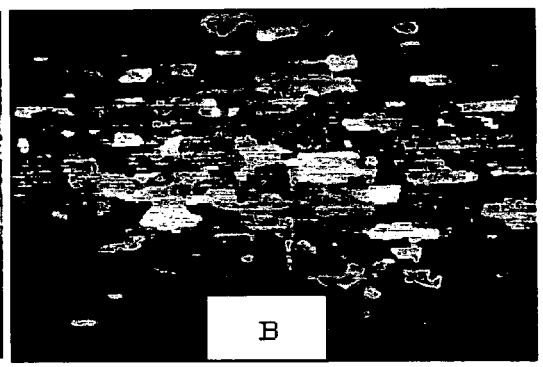
Fig.16
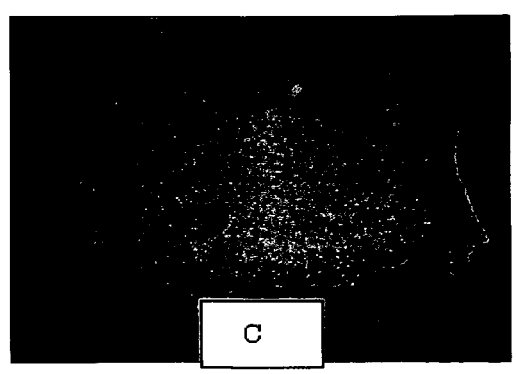

7000 Batches are finished.

Fig.29
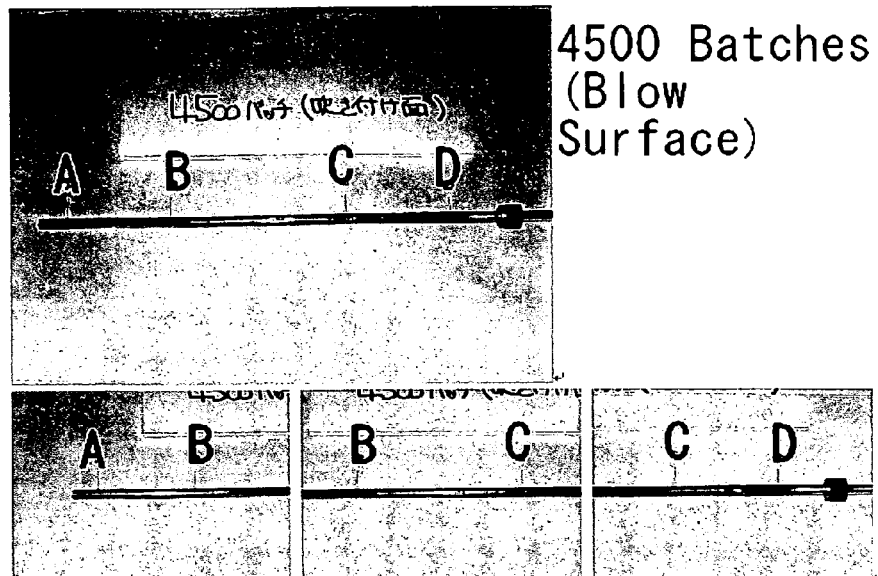
4500 Batches (Blow Surface)
Fig.30
Fig.31
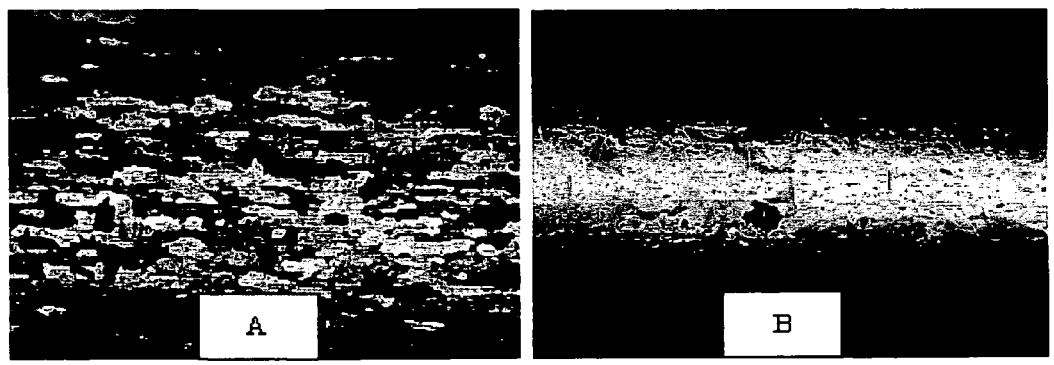
Fig.32
Fig.33
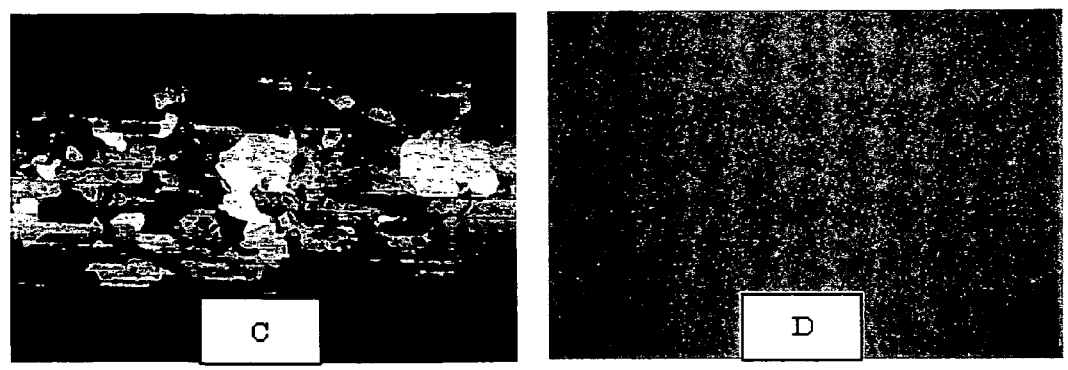

7000 Batches (Blow Surface)

Fig.40
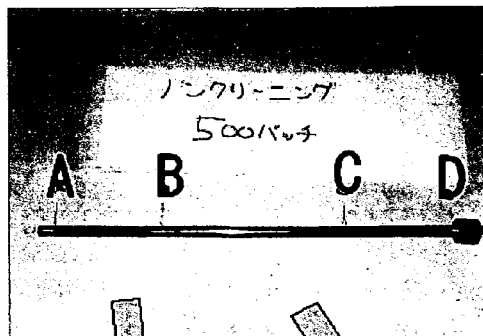
Non-Cleaning 500 Batches
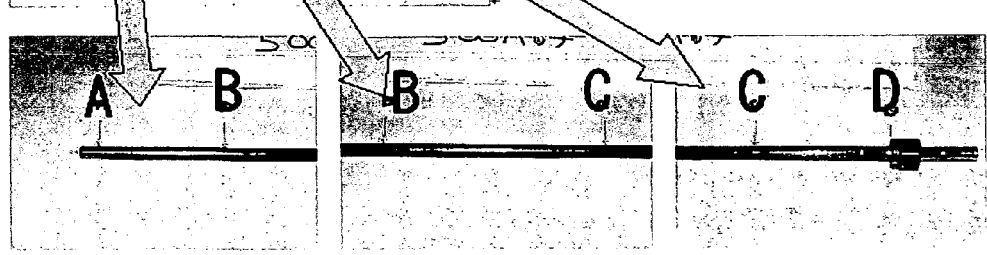
Fig.41
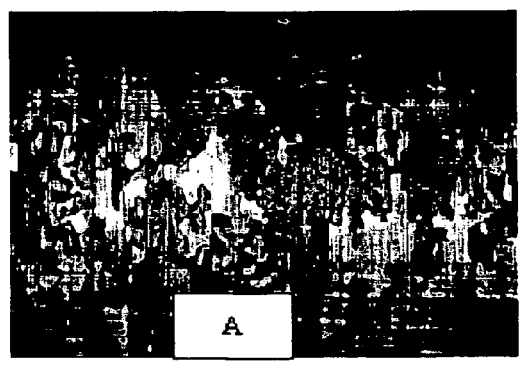
Fig.42
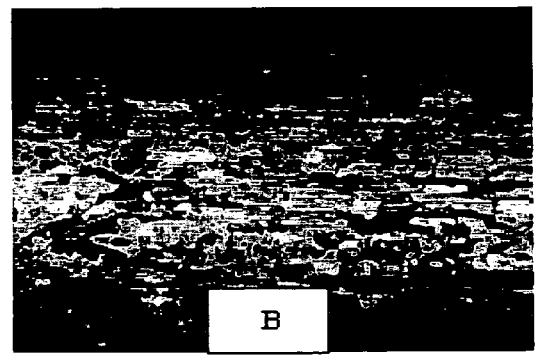
Fig.43
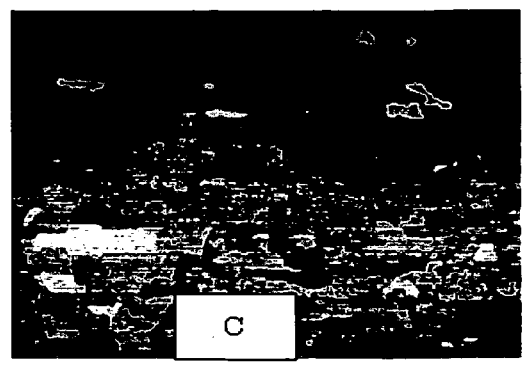
Fig.44
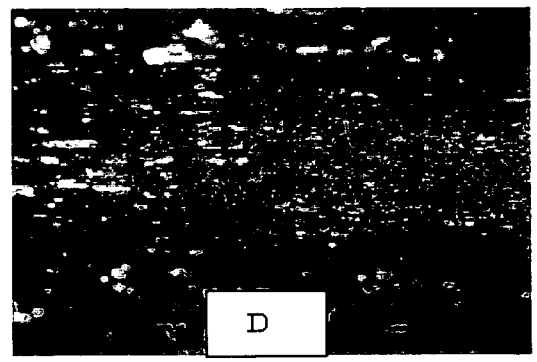

Non-Cleaning 600 Batches

METHOD AND DEVICE FOR CLEANING RAW MATERIAL GAS INTRODUCTION TUBE USED IN CVD FILM FORMING APPARATUS

TECHNICAL FIELD

The present invention relates to a method and an apparatus for cleaning a source gas introduction pipe used in a CVD (Chemical Vapor Deposition) apparatus which forms a CVD film, particularly a carbon film such as a DLC (Diamond-Like Carbon) film and a polymer-like amorphous carbon film or a silica film containing Si—C—H—O on an inner surface of a plastic container by a CVD method.

BACKGROUND ART

For example, Japanese Patent Application Laid-Open (JP-A) No. 8-53117 discloses a deposition apparatus which deposits the DLC film on the inner surface of the plastic container by adopting the CVD method, particularly a plasma CVD method, in order to improve gas barrier properties and the like. JP-A No. 10-258825 discloses a high-volume production apparatus and a method for producing the DLC film coating plastic container. Further, JP-A No. 10-226884 discloses an apparatus and a method for producing the DLC film plastic container, which can evenly apply the DLC film coating to the container having a protrusion protruding outward from an outer surface.

In JP-A No. 8-53117, an inner electrode of the apparatus for producing the DLC film coated plastic container is made of a conductive material and the inner electrode also used as piping for introducing source gas. The inner electrode is formed in a pipe shape having a source gas supply port at a leading end.

DISCLOSURE OF THE INVENTION

In the conventional production apparatus including the producing apparatus disclosed in JP-A No. 8-53117, when the DLC film is formed on the inner surface of the plastic container, contaminant mainly including carbon powder (hereinafter simply referred to as contaminant) adheres to the outer surface and inner surface of the source gas introduction pipe (inner electrode) which is one of members constituting the production apparatus. Therefore, when a large amount of DLC film coating containers is produced by repeatedly forming the DLC film on the inner surface of the plastic container, e.g. a PET bottle (bottle made of polyethylene terephthalate), the contaminant is deposited on the source gas introduction pipe to gradually become thick. Then, when the contaminant reaches a certain thickness (for example, the thickness of about 5 μm), the contaminant flakes away from the source gas introduction pipe. The contaminant which flakes away falls down inside the PET bottle. Consequently, a part in which the film is not formed is generated in the PET bottle by the contaminant which falls down inside the PET bottle, and gas barrier properties are decreased, which results in a defective.

The following method can be considered in order to prevent the contaminant from flaking away inside the PET bottle. Namely, there is the method in which, before the contaminant flakes away, the production apparatus is disassembled to detach the source gas introduction pipe, and a worker cleans the outer surface and the inner surface of the source gas introduction pipe to which the contaminant adheres by filing the contaminant. When the outer surface and the inner surface of the source gas introduction pipe are cleaned as described above, the contaminant should be prevented from flaking away inside the PET bottle.

The adoption of the above-described method can prevent the contaminant from flaking away inside the PET bottle. However, the quality of the DLC film coated plastic container is decreased unless the contaminant is removed in each about 200 to about 400 coatings, so that it is necessary that the source gas introduction pipe is frequently disassembled and cleaned. Therefore, operating efficiency of the DLC film deposition apparatus is extremely decreased.

When the contaminant adheres to the source gas introduction pipe (inner electrode), plasma discharge becomes unstable or discharge is stopped.

Therefore, the method and the apparatus for cleaning the source gas introduction pipe without decreasing the operation efficiency of the apparatus are required.

A problem of the invention is to be able to recover the contaminant so that the contaminant is not transferred to the plastic container or the deposition chamber while the contaminant is removed in a non-contact manner by spraying compressed air or blowing ultrasonic air to the source gas introduction pipe when the contaminant adheres to the inner surface and the outer surface of the source gas introduction pipe. The reason why the contaminant is removed in the non-contact manner is that, for example, apparatus failure such as deformation of the source gas introduction pipe is prevented and the generation of the uncoated portion caused by the adhesion of the contaminant is prevented. An object of the invention is to minimize the transfer of the contaminant to the deposition chamber or the plastic container after the deposition by optimizing a spray direction of the compressed air, a blow direction of the ultrasonic air, a position of a suction and exhaust portion, and a magnitude relation between the amount of air and the amount of suction and exhaust.

Another object of the invention is to intend to shorten a time required for the deposition of the CVD apparatus by simultaneously completing the recovering operation of the contaminant at optimal timing for removing the contaminant, that is, during extracting operation of the source gas introduction pipe. At this point, another object of the invention is to prevent the strong adhesion of the contaminant by cleaning the source gas introduction pipe in each deposition operation. This is because the adhesion becomes hardy by build-up of the contaminant.

Therefore, another object of the invention is to enable the CVD apparatus to perform continuous running not to decrease production operating efficiency of the CVD apparatus by extending an interval of disassembly and inspection of the DLC film deposition apparatus.

Similarly, for the source gas introduction pipe used in a rotary type plasma CVD apparatus of the high-volume production apparatus in which a production cycle is performed while a turntable on which the plurality of deposition chambers are arranged in a circle shape is rotated one turn, another object of the invention is to prevent the strong adhesion of the contaminant to the outer surface of the source gas introduction pipe, to easily remove the contaminant in a short period of time, to extend the interval of the disassembly and the inspection, and to improve the production operating efficiency.

Another object of the invention is to further easily sweep out and remove the contaminant without generating a reaction between the contaminant and the surface of the source gas introduction pipe by forming the substrate material used for the source gas introduction pipe which also acts as the inner electrode with SUS 304 whose surface is polished and by limiting the material of the hard gold alloy plating which is of the surface treatment to the acid hard gold plating such as 99.7Au-0.3Co and 99.8Au-0.2Ni.

Another object of the cleaning method and the cleaning apparatus of the invention is to propose a process for preventing the contaminant, in which the action of the extraction of the source gas introduction pipe from the deposition chamber is performed and the contaminant is swept out by utilizing the extracting action of the source gas introduction pipe in both the normal CVD apparatus and the rotary type CVD apparatus.

A method for cleaning a source gas introduction pipe used in a CVD apparatus according to this invention, which cleans contaminant mainly containing carbon powder adhering to an outer surface of the source gas introduction pipe during processes in which a plastic container is accommodated into a sealable deposition chamber having a function of an outer electrode, source gas is introduced from a source gas introduction pipe which is elevatably inserted into the plastic container and also acts as an inner electrode, and the source gas is excited into plasma to form a CVD (Chemical Vapor Deposition) film on an inner surface of the plastic container, is characterized in that, while compressed air is sprayed toward the contaminant, the contaminant removed by the spray of the compressed air is exhausted outside a system of the deposition chamber by suction and exhausting means so that the contaminant is not transferred to sides of the deposition chamber and the plastic container in which the CVD film is formed in a process for extracting the source gas introduction pipe from the plastic container after the CVD film is formed on the inner surface of the plastic container.

In a method for cleaning a source gas introduction pipe used in a CVD apparatus according to the invention, it is preferable that the compressed air is sprayed toward a centripetal direction of the source gas introduction pipe from a compressed air spray portion provided in an upper portion of the deposition chamber or at a position above the deposition chamber. At this point, it is also possible that each compressed air is sprayed toward the centripetal direction of the source gas introduction pipe from the compressed air spray portions which are arranged at a predetermined interval around the outside of the source gas introduction pipe (radially arranged with a center of an axis of the source gas introduction pipe) and provided in the upper portion of the deposition chamber or at the position above the deposition chamber.

In a method for cleaning a source gas introduction pipe used in a CVD apparatus according to the invention, it is preferable that the compressed air and the contaminant are sucked and removed into a suction and exhaust portion provided at the position above the spray portion by the suction and exhausting means.

In a method for cleaning a source gas introduction pipe used in a CVD apparatus according to the invention, it is preferable that the compressed air spray portion is provided in the upper portion of the deposition chamber or at the position above the deposition chamber, the suction and exhaust portion is provided at the position above the spray portion, a second compressed air spray portion is provided at the position above the suction and exhaust portion, the spray portion sprays the compressed air from the bottom toward the top and the second spray portion sprays the compressed air from the top toward the bottom, and the suction and exhaust portion sucks and removes the compressed air and the contaminant. Namely, in the spray of the compressed air, the compressed air spray portions are arranged opposite to each other while located around the outside of the source gas introduction pipe and at the different positions in a vertical direction, one of the compressed air spray portions provided in the upper portion of the deposition chamber or at the position above the deposition chamber sprays the compressed air from the top toward the bottom, and the other spray portion sprays the compressed air from the bottom toward the top.

In a method for cleaning a source gas introduction pipe used in a CVD apparatus according to the invention, it is preferable that the amount of suction and exhaust by the suction and exhausting means is larger than the amount of air supply of the compressed air. Therefore, the suction and exhausting means performs the powerful suction and exhaust.

In a method for cleaning a source gas introduction pipe used in a CVD apparatus according to the invention, it is preferable that deposition of the CVD film is performed in the plurality of deposition chambers arranged in a circle on a turntable, the contaminant mainly containing the carbon powder which adhere to the outer surface of the source gas introduction pipe is removed by spraying the compressed air in the process for extracting the source gas introduction pipe from the plastic container and the process for sucking and exhausting the removed contaminant outside the system of the deposition chamber is completed, while the turntable is rotated one turn.

A method for cleaning a source gas introduction pipe used in a CVD apparatus according to this invention, which cleans contaminant mainly containing carbon powder adhering to an outer surface of the source gas introduction pipe during processes in which a plastic bottle is accommodated into a sealable deposition chamber having a function of an outer electrode, source gas is introduced from a source gas introduction pipe which is elevatably inserted into the plastic bottle and also acts as an inner electrode, and the source gas is excited into plasma to form a CVD film on an inner surface of the plastic bottle, is characterized in that, while ultrasonic air is blown toward the contaminant, the contaminant removed by the blow of the ultrasonic air is exhausted outside a system of the deposition chamber by suction and exhausting means so that the contaminant is not transferred to sides of the deposition chamber and the plastic container in which the CVD film is formed in a process for extracting the source gas introduction pipe from the plastic container after the CVD film is formed on the inner surface of the plastic container.

In a method for cleaning a source gas introduction pipe used in a CVD apparatus according to the invention, it is preferable that the ultrasonic air is blown toward a centripetal direction of the source gas introduction pipe from an ultrasonic air blow portion provided in an upper portion of the deposition chamber or at a position above the deposition chamber. At this point, it is also possible that each ultrasonic air is blown toward the centripetal direction of the source gas introduction pipe from the ultrasonic air blow portions which are arranged at a predetermined interval around the outside of the source gas introduction pipe (radially arranged with a center of an axis of the source gas introduction pipe) and provided in the upper portion of the deposition chamber or at the position above the deposition chamber.

In a method for cleaning a source gas introduction pipe used in a CVD apparatus according to the invention, it is preferable that the ultrasonic air and the contaminant are sucked and removed into a suction and exhaust portion provided at the position above the blow portion by the suction and exhausting means.

In a method for cleaning a source gas introduction pipe used in a CVD apparatus according to the invention, it is preferable that the ultrasonic air blow portion is provided in the upper portion of the deposition chamber or at the position above the deposition chamber, the suction and exhaust portion is provided at the position above the blow portion, a second ultrasonic air blow portion is provided at the position above the suction and exhaust portion, the blow portion blows the ultrasonic air from the bottom toward the top, the second blow portion blows the ultrasonic air from the top toward the bottom, and the suction and exhaust portion sucks and removes the ultrasonic air and the contaminant. Namely, in the blow of the ultrasonic air, the ultrasonic air blow portions are arranged opposite to each other while located around the outside of the source gas introduction pipe and at the different positions in a vertical direction, one of the ultrasonic air blow portions provided in the upper portion of the deposition chamber or at the position above the deposition chamber blows the ultrasonic air from the top toward the bottom, and the other blow portion blows the ultrasonic air from the bottom toward the top.

In a method for cleaning a source gas introduction pipe used in a CVD apparatus according to the invention, it is preferable that the amount of suction and exhaust by the suction and exhausting means is larger than the amount of air supply of the ultrasonic air. Therefore, the suction and exhausting means performs the powerful suction and exhaust.

In a method for cleaning a source gas introduction pipe used in a CVD apparatus according to the invention, it is preferable that deposition of the CVD film is performed in the plurality of deposition chambers arranged in a circle on a turntable, the contaminant mainly containing the carbon powder which adhere to the outer surface of the source gas introduction pipe is removed by blowing the ultrasonic air in the process for extracting the source gas introduction pipe from the plastic container and the process for sucking and exhausting the removed contaminant outside the system of the deposition chamber is completed, while the turntable is rotated one turn.

An apparatus for cleaning a source gas introduction pipe used in a CVD apparatus according to this invention, which cleans contaminant mainly containing carbon powder adhering to an outer surface of the source gas introduction pipe during processes in which a plastic bottle is accommodated into a sealable deposition chamber having a function of an outer electrode, source gas is introduced from a source gas introduction pipe which is elevatably inserted into the plastic bottle and also acts as an inner electrode, and the source gas is excited into plasma to form a CVD film on an inner surface of the plastic bottle, is characterized by comprising source gas introduction pipe extracting means for extracting the source gas introduction pipe from the plastic container in synchronization with a time after the formation of the CVD film on the inner surface of the plastic container, compressed air spraying means for spraying compressed air toward the contaminant, and suction and exhausting means for exhausting the contaminant removed by the spray of the compressed air outside a system of the deposition chamber so that the contaminant is not transferred to sides of the deposition chamber and the plastic container in which the CVD film is formed.

In an apparatus for cleaning a source gas introduction pipe used in a CVD apparatus according to the invention, it is preferable that a spray portion of the compressed air sprayed by the compressed air spraying means is arranged around the outside of the source gas introduction pipe and in an upper portion of the deposition chamber or at a position above the deposition chamber. Namely, it is also possible that the compressed air spraying means is formed by the tapered compressed air spray portion arranged at a predetermined interval around the outside of the source gas introduction pipe (radially arranged with a center of an axis of the source gas introduction pipe).

In an apparatus for cleaning a source gas introduction pipe used in a CVD apparatus according to the invention, it is preferable that a suction and exhaust portion for sucking and removing the compressed air and the contaminant is arranged around the outside of the source gas introduction pipe and at the position above the spray portion.

In an apparatus for cleaning a source gas introduction pipe used in a CVD apparatus according to the invention, it is preferable that the spray portion of the compressed air sprayed by the compressed air spraying means is arranged around the outside of the source gas introduction pipe and in the upper portion of the deposition chamber or at the position above the deposition chamber, the suction and exhaust portion for sucking and removing the compressed air and the contaminant is arranged around the outside of the source gas introduction pipe and at the position above the spray portion, a second spray portion of the compressed air sprayed by the compressed air spraying means is arranged around the outside of the source gas introduction pipe and at the position above the suction and exhaust portion, a compressed air spray direction of the spray portion is orientated upward, and the compressed air spray direction of the second spray portion is orientated downward. Namely, the tapered compressed air spray portions are arranged opposite to each other while the upper position alternates with the bottom position around the outside of the source gas introduction pipe, one of the tapered compressed air spray portions is formed so as to spray the compressed air from the top toward the bottom, and the other spray portion is formed so as to spray the compressed air from the bottom toward the top.

An apparatus for cleaning a source gas introduction pipe used in a CVD apparatus according to this invention, which cleans contaminant mainly containing carbon powder adhering to an outer surface of the source gas introduction pipe during processes in which a plastic bottle is accommodated into a sealable deposition chamber having a function of an outer electrode, source gas is introduced from a source gas introduction pipe which is elevatably inserted into the plastic bottle and also acts as an inner electrode, and the source gas is excited into plasma to form a CVD film on an inner surface of the plastic bottle, is characterized by comprising source gas introduction pipe extracting means for extracting the source gas introduction pipe from the plastic container in synchronization with a time after the formation of the CVD film on the inner surface of the plastic container, ultrasonic air blowing means for blowing ultrasonic air toward the contaminant, and suction and exhausting means for exhausting the contaminant removed by the blow of the ultrasonic air outside a system of the deposition chamber so that the contaminant is not transferred to sides of the deposition chamber and the plastic container in which the CVD film is formed.

In an apparatus for cleaning a source gas introduction pipe used in a CVD apparatus according to the invention, it is preferable that a blow portion of the ultrasonic air blown by the ultrasonic air blowing means is arranged in an upper portion of the deposition chamber or at a position above the deposition chamber. At this point, it is also possible that the ultrasonic air blowing means which is arranged at a predetermined interval around the outside of the source gas introduction pipe (radially arranged with a center of an axis of the source gas introduction pipe) is formed by an ultrasonic oscillator which is provided in the upper portion of the deposition chamber or at the position above the deposition chamber.

In an apparatus for cleaning a source gas introduction pipe used in a CVD apparatus according to the invention, it is preferable that a suction and exhaust portion for sucking and removing the ultrasonic air and the contaminant is arranged at the position above the blow portion.

In an apparatus for cleaning a source gas introduction pipe used in a CVD apparatus according to the invention, it is preferable that the blow portion of the ultrasonic air blown by the ultrasonic air blowing means is arranged in the upper portion of the deposition chamber or at the position above the deposition chamber, the suction and exhaust portion for sucking and removing the ultrasonic air and the contaminant is arranged at the position above the blow portion, a second blow portion of the ultrasonic air blown by the ultrasonic air blowing means is arranged at the position above the suction and exhaust portion, an ultrasonic air blow direction of the blow portion is orientated upward, and the ultrasonic air blow direction of the second blow portion is orientated downward. Namely, the ultrasonic air blowing means are arranged opposite to each other while the upper position alternates with the bottom position around the outside of the source gas introduction pipe, one of the ultrasonic air blow portions formed by the ultrasonic oscillator provided in an upper portion of the deposition chamber or at a position above the deposition chamber is formed so as to blow the ultrasonic air from the top toward the bottom, and the other blow portion is formed so as to blow the ultrasonic air from the bottom toward the top.

In the case where the source gas introduction pipe does not also act as the inner electrode as described below, plasma generating means in the deposition chamber is used in a micro wave generation apparatus. Namely, a method for cleaning a source gas introduction pipe used in a CVD apparatus according to this invention, which cleans contaminant mainly containing carbon powder adhering to an outer surface of the source gas introduction pipe during processes in which a plastic bottle is accommodated into a sealable deposition chamber having a function of an outer electrode, source gas is introduced from a source gas introduction pipe which is elevatably inserted into the plastic bottle, and the source gas is excited into plasma with a micro wave to form a CVD film on an inner surface of the plastic bottle, is characterized in that, while compressed air is sprayed toward the contaminant or ultrasonic air is blown toward the contaminant, the contaminant removed by the spray of the compressed air or the blow of the ultrasonic air is exhausted outside a system of the deposition chamber by suction and exhausting means so that the contaminant is not transferred to sides of the deposition chamber and the plastic container in which the CVD film is formed in a process for extracting the source gas introduction pipe from the plastic container after the CVD film is formed on the inner surface of the plastic container.

In an apparatus for cleaning a source gas introduction pipe used in a CVD apparatus according to this invention, which cleans contaminant mainly containing carbon powder adhering to an outer surface of the source gas introduction pipe during processes in which a plastic bottle is accommodated into a sealable deposition chamber having a function of an outer electrode, source gas is introduced from a source gas introduction pipe which is elevatably inserted into the plastic bottle, and the source gas is excited into plasma with a micro wave to form a CVD film on an inner surface of the plastic bottle, is characterized by comprising source gas introduction pipe extracting means for extracting the source gas introduction pipe from the plastic container in synchronization with a time after the formation of the CVD film on the inner surface of the plastic container, compressed air spraying means for spraying compressed air toward the contaminant, and suction and exhausting means for exhausting the contaminant removed by the spray of the compressed air outside a system of the deposition chamber so that the contaminant is not transferred to sides of the deposition chamber and the plastic container in which the CVD film is formed.

In an apparatus for cleaning a source gas introduction pipe used in a CVD apparatus according to this invention, which cleans contaminant mainly containing carbon powder adhering to an outer surface of the source gas introduction pipe during processes in which a plastic bottle is accommodated into a sealable deposition chamber having a function of an outer electrode, source gas is introduced from a source gas introduction pipe which is elevatably inserted into the plastic bottle, and the source gas is excited into plasma with a micro wave to form a CVD film on an inner surface of the plastic bottle, is characterized by comprising source gas introduction pipe extracting means for extracting the source gas introduction pipe from the plastic container in synchronization with a time after the formation of the CVD film on the inner surface of the plastic container, ultrasonic air blowing means for blowing ultrasonic air toward the contaminant, and suction and exhausting means for exhausting the contaminant removed by the blow of the ultrasonic air outside a system of the deposition chamber so that the contaminant is not transferred to sides of the deposition chamber and the plastic container in which the CVD film is formed.

In an apparatus for cleaning a source gas introduction pipe used in a CVD apparatus according to the invention, it is preferable that a substrate material used for the source gas introduction pipe is made of SUS 304 or SUS 316 whose surface is polished or a material in which SUS 304 or SUS 316 is coated with acid hard gold plating such as 99.7Au-0.3Co and 99.8Au-0.2Ni which is of the material of surface treatment.

In the invention, the contaminant mainly containing the carbon powder which adhere to the outer surface of the source gas introduction pipe can be rapidly and easily removed by spraying the compressed air toward the contaminant or blowing the ultrasonic air toward the contaminant in a non-contact manner. Since the contaminant is removed in the non-contact manner, there is no fear that the source gas introduction pipe is deformed. Further, proper vibration is added to a pipe wall by pressure of the compressed air, so that the contaminant can be effectively removed. Since the removed contaminant is exhausted to the outside by the suction and exhausting means, the contaminant peeled off from the surface of the source gas introduction pipe is not transferred to the sides of the deposition chamber and the plastic container. In particular, the compressed air is sprayed from the bottom toward the top and the contaminant and the air are sucked and exhausted at the position above the spray of the compressed air, so that the contaminant transferred to the deposition chamber and the plastic container can be minimized. When the compressed air is sprayed from the top toward the bottom, the contaminant is easily transferred to the deposition chamber and the plastic container which are located at the lower portion.

The time required for the deposition of the CVD apparatus can be shortened by simultaneously completing recovering operation of the contaminant during the extracting operation of the source gas introduction pipe. Further, the strong adhesion of the contaminant can be prevented by cleaning the source gas introduction pipe in each deposition.

Therefore, the interval of disassembly and inspection of the DLC film deposition apparatus can be prolonged to perform the continuous running, and the production operating efficiency of the CVD apparatus is not decreased.

The invention can be similarly applied to the source gas introduction pipe used in a rotary type of plasma CVD apparatus. The contaminant can be easily removed while the turntable is rotated one turn, the continuous running of the deposition operation can be performed. Further, the contaminant can be easily removed in a short period of time, the interval of the disassembly and the inspection can be prolonged, and the production operating efficiency can be improved.

In the invention, the substrate material used for the source gas introduction pipe which also acts as the inner electrode is made of SUS 304 whose surface is polished, and the material of the hard gold alloy plating which is of the surface treatment is limited to the acid hard gold plating such as 99.7Au-0.3Co and 99.8Au-0.2Ni. Therefore, the contaminant can be further easily swept out and removed without generating the reaction between the contaminant and the surface of the source gas introduction pipe.

BRIEF DESCRIPTION OF THE DRAWINGS

FIG. 2 is a schematic diagram showing a mode of the device for cleaning the source gas introduction pipe used in the CVD apparatus according to the invention, FIG. 2A is a longitudinal sectional view showing a relationship between a supply system and an exhaust system, FIG. 2B is a transverse sectional view on a compressed air supply side, and FIG. 2C is a transverse sectional view on a exhaust side of carbon powder and the like;

FIG. 8 shows the inner electrode photograph after 2000 batches are completed;

FIG. 9 shows the A part of the inner electrode bottom portion macrophotograph (50 times) after 2000 batches are completed;

FIG. 10 shows the B part of the inner electrode body portion macrophotograph (50 times) after 2000 batches are completed;

FIG. 11 shows the C part of the inner electrode bottle mouth portion macrophotograph (50 times) after 2000 batches are completed;

FIG. 12 shows the D part of the inner electrode exhaust manifold portion macrophotograph (50 times) after 2000 batches are completed;

FIG. 13 shows the inner electrode photograph after 4500 batches are completed;

FIG. 14 shows the A part of the inner electrode bottom portion macrophotograph (50 times) after 4500 batches are completed;

FIG. 15 shows the B part of the inner electrode body portion macrophotograph (50 times) after 4500 batches are completed;

FIG. 16 shows the C part of the inner electrode bottle mouth portion macrophotograph (50 times) after 4500 batches are completed;

FIGS. 22A to 22E show operation states;

FIG. 29 shows the inner electrode photograph after 4500 batches are completed;

FIG. 30 shows the A part of the inner electrode bottom portion macrophotograph (50 times) after 4500 batches are completed;

FIG. 31 shows the B part of the inner electrode body portion macrophotograph (50 times) after 4500 batches are completed;

FIG. 32 shows the C part of the inner electrode bottle mouth portion macrophotograph (50 times) after 4500 batches are completed;

FIG. 33 shows the D part of the inner electrode exhaust manifold portion macrophotograph (50 times) after 4500 batches are completed;

FIG. 40 shows an inner electrode photograph of a comparative example after 500 batches are completed;

FIG. 41 shows an Apart of an inner electrode bottom portion macrophotograph (50 times) of the comparative example after 500 batches are completed;

FIG. 42 shows a B part of an inner electrode body portion macrophotograph (50 times) of the comparative example after 500 batches are completed;

FIG. 43 shows a C part of an inner electrode bottle mouth portion macrophotograph (50 times) of the comparative example after 500 batches are completed;

FIG. 44 shows a D part of an inner electrode exhaust manifold portion macrophotograph (50 times) of the comparative example after 500 batches are completed;

BEST MODE FOR CARRYING OUT THE INVENTION

Figure 1:
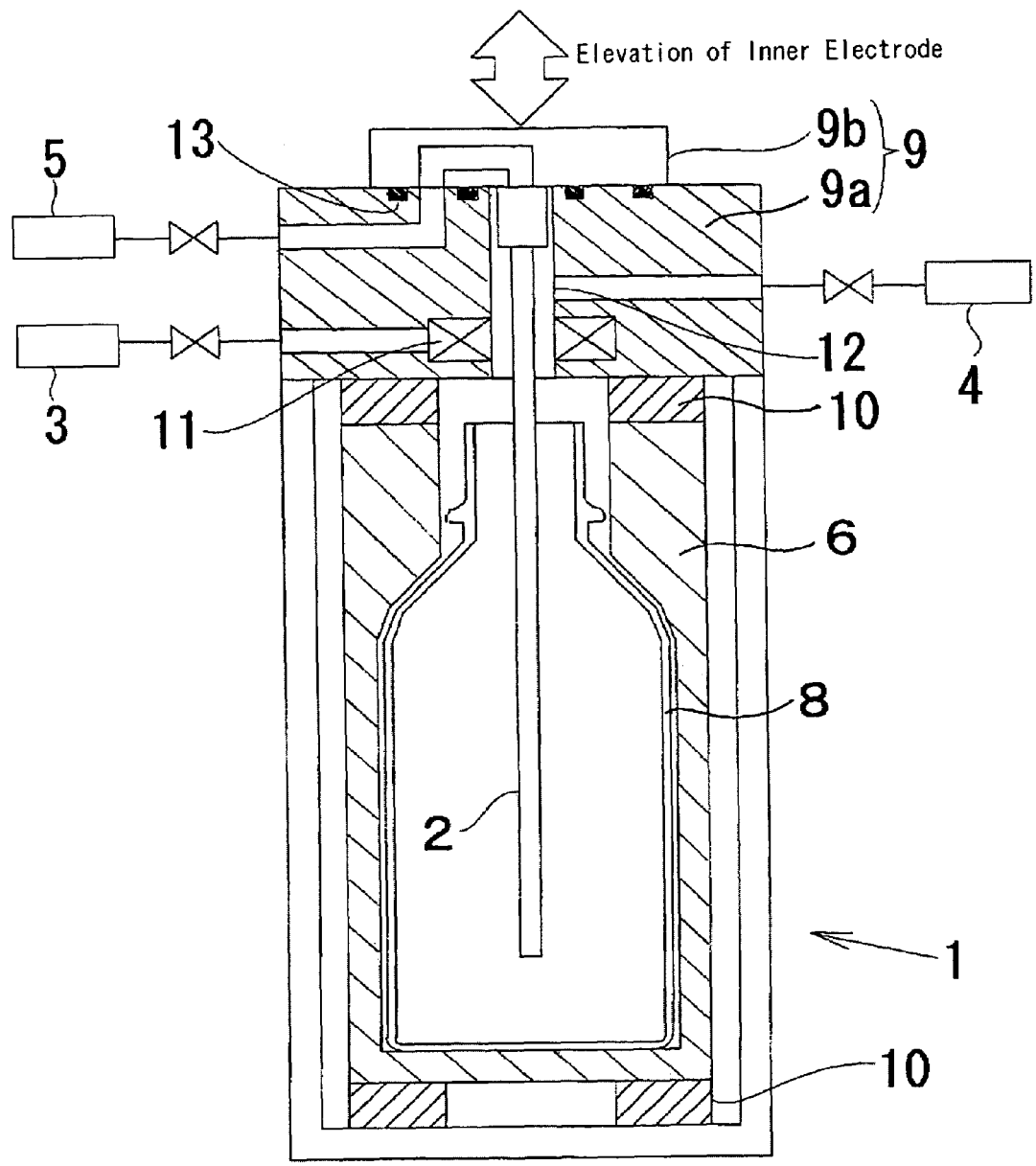
FIG. 1 is a schematic diagram showing a mode of a deposition chamber of a CVD apparatus and a device for cleaning a source gas introduction pipe according to the invention.

Referring to the accompanying drawings, embodiments will be described below. However, the invention is not limited to the embodiments. When the member is commonly used in each drawing, the component is represented by the same reference numerals. Although the examples are described by adopting the source gas introduction pipe which also acts as the inner electrode as an example, needless to say, the invention can be also applied to the source gas introduction pipe which does not act as the inner electrode. Further, similarly to the case of the source gas introduction pipe, the cleaning method can be applied to the inner electrode in the case where the source gas introduction pipe does not act as the inner electrode.

The CVD apparatus to which the invention is applied will be generally described first. FIG. 1 is a schematic diagram showing a mode of the deposition chamber of the CVD apparatus and the device for cleaning the source gas introduction pipe according to the invention. The CVD apparatus according to the invention is a plasma CVD apparatus including a deposition chamber 1, a source gas introduction pipe 2 which also acts as the inner electrode introducing the source gas excited into the plasma state into the inside of a plastic container 8 accommodated in the deposition chamber 1, high frequency supplying means (not shown) for supplying high frequency to an outer electrode 6 of the deposition chamber 1, compressed air spraying means 3 for removing contaminant which mainly contains carbon powder adhering to an outer surface of the inner electrode (source gas introduction pipe) 2, and powerful suction and exhausting means 4 for sucking and removing the contaminant so that the contaminant removed from the surface of the source gas introduction pipe 2 is not transferred onto the sides of the deposition chamber 1 and the plastic container 8 in which the CVD film is formed. The CVD apparatus is one in which the CVD film is formed on the inner surface of the plastic container 8 by supplying the high frequency to the outer electrode 6 to excite the source gas into the plasma state in the plastic container 8. In the CVD apparatus, it is possible that one deposition chamber or the plurality of deposition chambers is arranged. In the case where the plurality of deposition chambers is arranged, it is possible to use a batch type CVD apparatus in which the deposition is simultaneously performed in all the deposition chambers, or it is possible to use a rotary type continuous CVD apparatus in which the plurality of deposition chambers are placed on a turntable.

The deposition chamber 1 comprises the outer electrode 6 which accommodates the plastic container 8, the source gas introduction pipe 2 which also acts as the inner electrode which is connected to a ground while elevatably arranged inside the plastic container 8, and a cover 9 which is openable and closable. The deposition chamber 1 forms a sealable vacuum chamber.

The cover 9 is formed by an electrically conductive member. The cover 9 includes a lower cover 9a arranged in an upper portion of the deposition chamber 1 and an upper cover 9b arranged on the upper portion of the lower cover 9a. The upper cover 9b is designed to be elevatable while supporting the source gas introduction pipe 2 which also acts as the inner electrode. Therefore, the source gas introduction pipe 2 integral with the upper cover 9b can be elevated by elevating the upper cover 9b. An insulating member 10 is provided on the lower surface of the cover 9. When the source gas introduction pipe 2 which also acts as the inner electrode is inserted into the plastic container 8, the inner electrode 2 and the outer electrode 6 are insulated from each other by the insulating member 10.

Source gas introduction pipe extracting means (not shown) is one which extracts the source gas introduction pipe 2 from the inside of the plastic container at timing after the CVD film is formed on the inner surface of the plastic container 8. For example, the source gas introduction pipe extracting means is a mechanism which is connected to the upper cover 9b to elevate the upper cover 9b.

The lower cover 9a and the upper cover 9b are sealed from the outside with an O-ring 13 arranged therebetween.

An opening communicating with an accommodation space in the outer electrode 6 is provided in the cover 9. The source gas introduction pipe 2 is inserted into the opening. A compressed air spray portion 11 for spraying the air supplied from the compressed air spraying means 3 toward the source gas introduction pipe 2 is provided in the inner surface of the opening of the cover 9. It is preferable to generate the powerful compressed air by forming the spray portion 11 in a tapered shape. A suction and exhausting portion 12 for sucking and removing both the compressed air sprayed and the removed contaminant is provided in the inner surface of the opening of the cover 9. The suction and exhaust portion 12 is connected to the suction and exhausting means 4. The air is sucked by actuating the suction and exhausting means 4 while the suction and exhaust portion 12 function as a suction port. At this point, as shown in FIG. 1, it is possible that the compressed air is sprayed upward from the spray portion 11 and the air is sucked into the suction and exhaust portion 12 provided above the spray portion 11. The transfer of the contaminant to the deposition chamber and the plastic container can be prevented by setting a wind direction of the compressed air upward.

FIG. 2 is a schematic diagram showing a mode of the device for cleaning the source gas introduction pipe used in the CVD apparatus according to the invention. FIG. 2A is referred to first. When the source gas introduction pipe (inner electrode) is lifted, the compressed air is sprayed toward the source gas introduction pipe through the inside of the cover 9. As shown in FIG. 2B, the spray of the compressed air is performed toward a centripetal direction while an axial center of the source gas introduction pipe is set to the center. This allows the contaminant adhering to the outer surface of the source gas introduction pipe to be removed evenly. As shown in FIG. 2A, the removed contaminant and the air from the compressed air are sucked and exhausted above the spray portion. This is because the contaminant is prevented from falling down to a mouth portion to mix into the inside of the container. As shown in FIG. 2C, the exhaust is performed toward a radial direction while the axial center of the source gas introduction pipe is set to the center.

Figure 50:
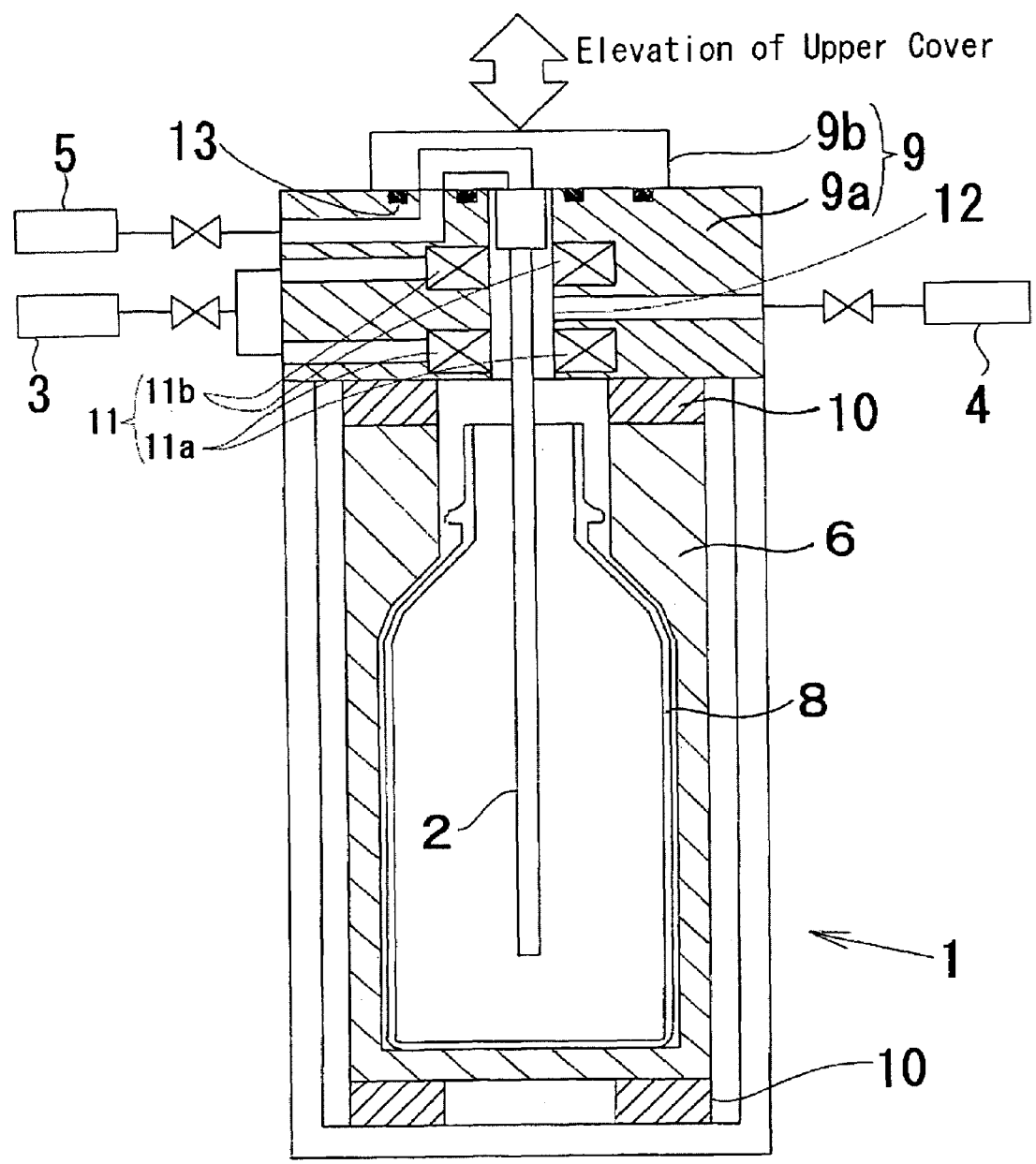
FIG. 50 is a schematic diagram showing a second mode of the deposition chamber of the CVD apparatus and the device for cleaning the source gas introduction pipe according to the invention.

It is possible that the spray portion and the suction and exhaust portion which are provided in the cover are formed in a second mode shown below. FIG. 50 is a schematic diagram showing the second mode of the deposition chamber of the CVD apparatus and the device for cleaning the source gas introduction pipe according to the invention. In the apparatus of the second mode, a spray portion 11a of the compressed air sprayed by the compressed air spraying means 3 is arranged in the upper portion of the deposition chamber 1 or at a position above the deposition chamber 1, and in a periphery of the outer surface of the source gas introduction pipe 2. The suction and exhaust portion 12 for sucking and removing the compressed air and the contaminant is arranged in the periphery of the outer surface of the source gas introduction pipe 2 at a position above the spray portion 11a. Further, a second spray portion 11b of the compressed air sprayed from the compressed air spraying means 3 is arranged in the periphery of the outer surface of the source gas introduction pipe 2 at a position above the suction and exhaust portion 12. The compressed air spray direction of the spray portion 11a is directed upward, the compressed air spray direction of the second spray portion 11b is directed downward, and the air is sucked into the suction and exhaust portion 12 arranged therebetween. Therefore, the compressed air and the contaminant can be removed without fly-off.

In the first mode and the second mode, the compressed air and the contaminant can be further removed without fly-off by making the amount of suction and exhaust by the suction and exhausting means 4 larger than the amount of air supply of the compressed air. In this case, it is preferable that the amount of suction and exhaust is equal to or larger than 1.5 times of the amount of air supply of the compressed air.

A space is formed inside the outer electrode 6, and the space is the accommodation space for accommodating the plastic container 8 to be coated, e.g. a PET bottle which is of the bottle made of polyethylene terephthalate. The accommodation space in the outer electrode 6 is formed so as to be able to accommodate the plastic container 8 accommodated therein. Namely, it is preferable that the accommodation space is formed so as to be slightly larger than an outer shape of the plastic container 8. Namely, it is preferable that an inner wall surface of the accommodation space of the container is formed in the shape surrounding a neighborhood of the outer surface of the plastic container 8, particularly in the shape geometrically similar to the plastic container. However, in the case where bias voltage is applied to the inner surface of the plastic container 8, it is not necessary that the inner wall surface of the accommodation space in the outer electrode is formed in the shape surrounding the neighborhood of the outer surface of the plastic container 8, and it is possible that a gap is formed between the inner wall surface of the accommodation space and the outer surface of the plastic container 8.

The accommodation space in the outer electrode 6 is sealed from the outside by the O-ring (not shown) arranged between the insulating member 10 and the cover 9.

The source gas introduction pipe 2 which also acts as the inner electrode is arranged in the outer electrode 6 and arranged inside the plastic container 8. The source gas introduction pipe 2 which also acts as the inner electrode is supported by the upper cover 9b and moved elevatably with the upper cover 9b. A tip of the source gas introduction pipe 2 which also acts as the inner electrode is arranged inside the space in the outer electrode 6 and inside the plastic container 8 accommodated in the outer electrode 6. A gas outlet is provided at the tip of the source gas introduction pipe 2. Further, the source gas introduction pipe 2 which acts as the inner electrode is connected to a ground.

It is preferable that the source gas introduction pipe 2 which acts as the inner electrode is formed by a conductive tubular base plated with a hard gold alloy. In this case, it is preferable that the conductive tubular base is made of a SUS 304 material whose surface is polished. This is because SUS 304 has corrosion resistance and high strength. It is preferable that the polishing is performed by machining to finish SUS 304 to a mirror surface of buff #600. It is also possible that the conductive tubular base is made of SUS 316.

The reason why the hard gold alloy plating is adopted is that a reaction with the contaminant is suppressed. It is preferable that a thickness of plating ranges 2 to 10 μm. It is preferable that a kind of the hard gold alloy plating is acid hard gold plating such as 99.7Au-0.3Co and 99.8Au-0.2Ni. Although pure gold plating has the best corrosion resistance, the pure gold plating has weak mechanical strength such as wear resistance and hardness. The mechanical strength such as the corrosion resistance, the wear resistance, and the hardness is improved in the acid hard gold plating such as 99.7Au-0.3Co and 99.8Au-0.2Ni, so that the acid hard gold plating is suitable for a plating material of the inner electrode. Although the hardness of other gold alloys (25Ag and 20Cu) is higher than that of the acid hard gold plating, they are inferior to the acid hard gold plating in the wear resistance and the corrosion resistance. The method in which the polishing (mirror surface polishing of buff #600) is performed to the SUS 304 material by the machining, electroless plating of nickel is performed to the polished SUS 304 material, and then the gold plating is performed on the nickel electroless plating layer is adopted as the gold plating method.

In order to prevent the generation of the plasma in the pipe of the inner electrode, it is preferable that an inner diameter of the source gas introduction pipe 2 which also acts the inner electrode is not more than 1.5 mm, and it is more preferable that the source gas introduction pipe 2 is equal to or less than 1.0 mm. The generation of the contaminant can be suppressed in the pipe of the inner electrode by forming the inner diameter of the source gas introduction pipe 2 not more than 1.5 mm. In order to secure the mechanical strength, it is preferable that the thickness of the inner electrode is not lower than 1 mm.

By forming the source gas introduction pipe 2 which also acts as the inner electrode as described above, the fixing of the contaminant can be prevented and the plasma discharge can be stabilized.

The plastic container includes the container which is used with the cover, a stopper, or a seal and the container which is used in the open state without the cover, the stopper, or the seal. A size of the opening depends on contents. The plastic container includes one which has a predetermined thickness having proper rigidity and one which is formed by a sheet material not having the rigidity. Beverages such as a carbonated beverage, a fruit juice beverage, and a soft drink, pharmaceutical products, agricultural chemicals, dehydrated foods for which moisture absorption is bad, and the like can be cited as an example of filling materials of the plastic container according to the invention.

Polyethylene terephthalate resin (PET), polyethylene terephthalate copolyester resin (copolymer in which cyclohexane dimethanol is used for an alcohol component of polyester instead of ethylene glycol is referred to as PETG, manufactured by Eastman Chemical Company), polybutylene terephthalate resin, polyethylene naphthalate resin, polyethylene resin, polypropylene resin (PP), cycloolefin copolymer resin (COC, cyclic olefin copolymerization), ionomer resin, poly-4-methylpentene-1 resin, polymethyl methacrylate resin, polystylene resin, ethylene-vinyl alcohol copolymerization resin, acrylonitrile resin, polyvinyl chloride resin, polyvinylidene chloride resin, polyamide resin, polyamideimide resin, polyacetal resin, polycarbonate resin, polysulfone resin, tetrafluoroethylene resin, acrylonitrile-styrene resin, and acrylonitrile-butadiene-styrene resin can be cited as an example of resins used in forming the plastic container. Among these resins, PET is particularly preferable to the plastic container.

The source gas introduction pipe 2 introduces the source gas supplied from a source gas generation source 5 to the inside of the plastic container. The source gas generation source generates hydrocarbon gas such as acetylene.

The source gas introduction pipe 2 supplies the source gas to the deposition chamber 1. In the case where the plurality of deposition chambers is provided, it is possible that the source gas generation source 5 is provided in each deposition chamber, or it is possible that one source gas generation source is diverged to introduce the source gas to all the deposition chambers. In this case, branch pipes corresponding to the number of deposition chambers are provided between the source gas generation source 5 and a mass-flow controller (not shown). The mass-flow controllers are placed so that the number of mass-flow controllers is equal to the number of deposition chambers. In either case, the invention is not limited to the number of the source gas generation sources along as the predetermined amount of source gas can be supplied to each deposition chamber.

For example, in the case where a DLC film is formed, aliphatic hydrocarbons, aromatic hydrocarbons, oxygen-containing hydrocarbons, nitrogen-containing hydrocarbons, and the like which are gas or liquid at room temperature are used as the source gas. In particular, it is desirable to benzene, toluene, o-xylene, m-xylene, p-xylene, cyclohexane, and the like whose carbon number is at least six. In the case where the invention is used for the container such as the food container, from the viewpoint of hygiene, it is preferable to use aliphatic hydrocarbons, particularly ethylene hydrocarbon such as ethylene, propylene, and butylene or acetylene hydrocarbon such as acetylene, allylene, and 1-butyne. These sources can be used alone, or the sources can be used as mixed gas containing at least two kinds of sources. Further, it is also possible to use these kinds of gas by diluting the gas with a rare gas such as argon and helium. In the case where the silicon containing DLC film is formed, silicon containing hydrocarbon gas is used.

The DLC film formed on the inner surface of the plastic container is the film referred to as i-carbon film or hydrogenated amorphous carbon film (a-C:H), and the DLC film includes a hard carbon film. The DLC film is the amorphous carbon film, and the DLC film also has $Sp^3$ bond. Hydrocarbon gas, e.g. acetylene gas is used as the source gas for forming the DLC film. Silicon containing hydrocarbon gas is used as the source gas for forming the silicon containing DLC film. The container which can be used for a one-way container or a returnable container can be obtained as the container for the carbonated beverage, sparkling drink, or the like by forming the DLC film on the inner surface of the plastic container.

The accommodation space in the deposition chamber 1 is connected to a vacuum pump (not shown) through a pipe (not shown) and a vacuum valve. The vacuum pump is connected to an exhaust duct (not shown). In the case of the plurality of deposition chambers, it is possible that evacuation-systems are gathered together to one vacuum pump to perform the evacuation, or it is possible that the plurality of vacuum pumps shares the evacuation.

High-frequency supplying means includes fixed matching device (not shown) attached to the outer electrode and a high-frequency power source (not shown) connected to the fixed matching device. The high-frequency power source is one which generates the high frequency which is of the energy for exciting the source gas into the plasma in the plastic container. In order to perform matching quickly to reduce a time necessary to the ignition of the plasma, it is preferable that the high-frequency power source is a transistor type high-frequency power source and the high-frequency in which the matching is performed in a frequency movable manner or in an electronic manner. The frequency of the high-frequency power source ranges from 100 kHz to 1000 MHz. For example, 13.56 MHz which is of an industrial frequency is used.

Instead of the supply of the high-frequency power to the outer electrode 6, it is possible that a micro wave is supplied toward the inside of the container to excite the source gas into the plasma. In this case, although the source gas introduction pipe does not act as the inner electrode, similarly the contaminant adheres, so that the contaminant can be similarly removed by the cleaning method and apparatus according to the invention.

Figure 51:
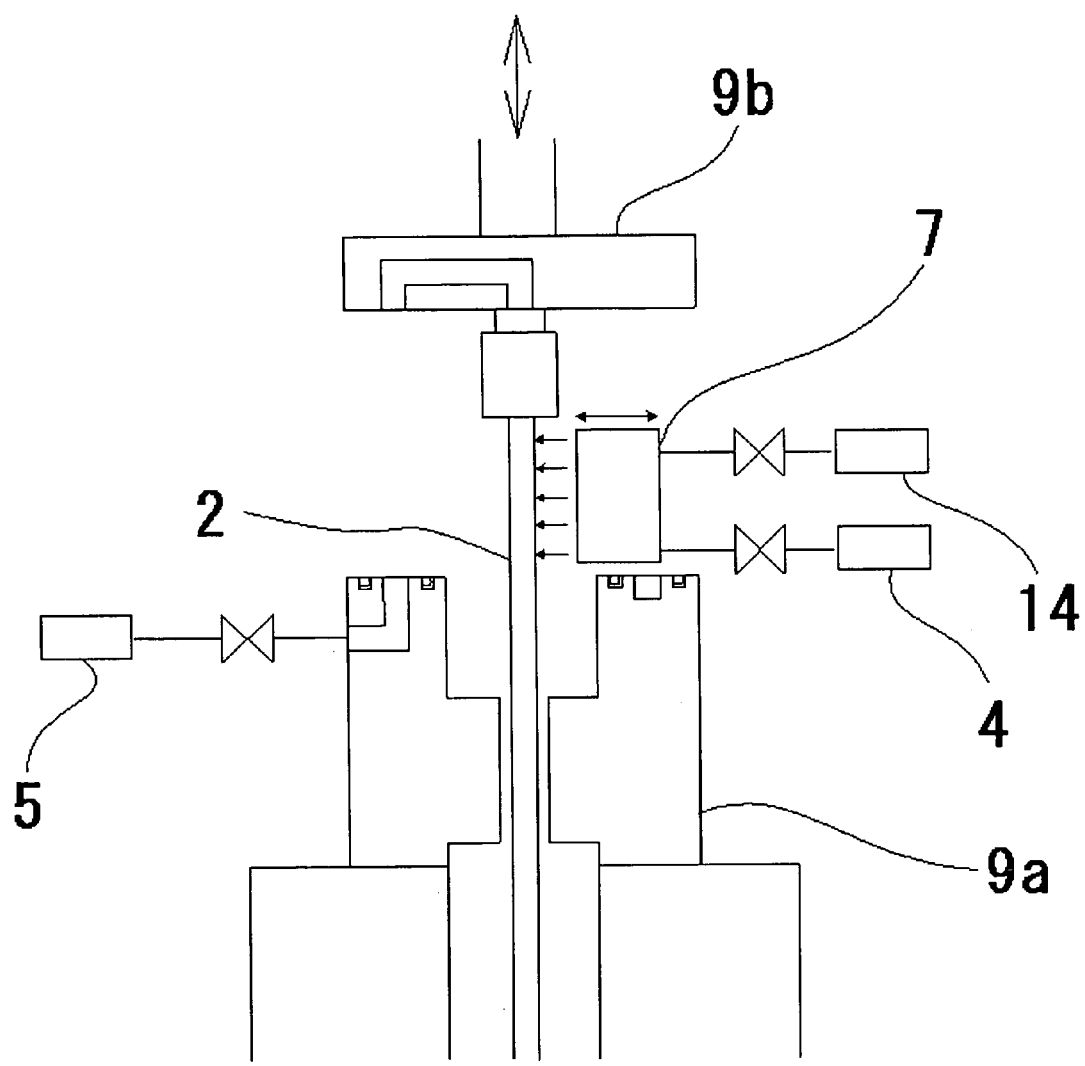
FIG. 51 is a partial conceptual view of an upper portion of the deposition chamber when ultrasonic air blowing means is provided instead of compressed air spraying means.

Although the compressed air is mainly sprayed to remove the contaminant in the above-described embodiment, as shown in FIG. 51, instead of the compressed air, it is also possible that ultrasonic air is blown toward the contaminant which adheres to the source gas introduction pipe. FIG. 51 is a partial conceptual view of the upper portion of the deposition chamber when ultrasonic air blowing means is provided instead of the compressed air spraying means. The air is supplied from air supplying means 14 for ultrasonic air blowing means to ultrasonic air blowing means 7. An ultrasonic oscillator included in the ultrasonic air blowing means 7 gives vibration by ultrasound to the air, and the ultrasonic air is blown from a blow portion (not shown) toward the contaminant. This allows the contaminant to be removed as in the case of the spray of the compressed air. The contaminant is sucked and removed by the suction and exhausting means 4 connected to a suction and exhaust portion (not shown) installed in the ultrasonic air blowing means 7. It is preferable that the suction and exhaust portion is provided above the ultrasonic air blow portion, and it is more preferable that the suction and exhaust portion is provided above the ultrasonic air blow portion and around the outside of the source gas introduction pipe. As in the case of the spray of the compressed air, it is more preferable that the blow portion, suction and exhaust portion, and the second blow portion are sequentially arranged in the axial direction from the lower portion to the upper portion of the source gas introduction pipe. More preferably, the blow portion, suction and exhaust portion, and the second blow portion are provided around the outside of the source gas introduction pipe respectively. Although the mode in which the ultrasonic air is blown from one direction is shown in FIG. 51, it is more preferable that the ultrasonic air blown from the centripetal direction with respect to the axis of the source gas introduction pipe.

Cleaning Evaluation Experiment 1 of Source Gas Introduction Pipe which also Acts as Inner Electrode

[Inside Chamber Compressed Air Blow Method]

In a process of extracting the source gas introduction pipe from the plastic container after the CVD film is formed on the inner surface of the plastic container, the mechanism in which, while the compressed air is sprayed toward the contaminant which adheres to the outer surface of the source gas introduction pipe and mainly contains the carbon powder, the contaminant is exhausted outside the deposition chamber system by the powerful suction and exhausting means so that the contaminant removed from the outer surface of the source gas introduction pipe by the spray of the compressed air is not transferred to the sides of the deposition chamber and the plastic container in which the CVD film is formed will be specifically described below. A cleaning evaluation was performed on the following conditions using the apparatus shown in FIG. 1.

1. Deposition Process Conditions a) Evacuation System

An ultimate pressure was set to 6.65 Pa, and a deposition pressure was set to 26.6 Pa. At this point, the pressure is a degree of vacuum at the evacuation manifold.

b) Gas Supply System

The kind of the gas was $C_2H_2$ (acetylene), and a gas flow rate was set to 50 sccm. A gas stabilizing time was set to 1.0 second until the deposition was started after the deposition chamber reached the deposition pressure.

c) RF (High Frequency) Supply System

RF output was set to 400 W, the frequency was set to 13.56 MHz, and a discharge time was 3.0 seconds.

2. Cleaning Conditions (Air Supply System)

a) Compressed Air Spray System

An air supply pressure was set to 0.3 MPa, and an air supply flow rate was set to 170 l/min.

b) Suction and Exhaust System (Dust Exhaust System)

An exhaust flow rate was set to 180 l/min.

c) Elevating Condition of Source Gas Introduction Pipe which also Acts as Inner Electrode In cylinder elevating speed, rise speed was set to about 1.1 seconds and fall speed was set to about 0.5 second. A stroke length of the elevation was set to 295 mm.

3. Work (Inner Electrode Specifications)

a) The size a BA pipe was set to 6.35 mm in diameter.

b) Au alloy Plating was performed to the inner electrode as surface treatment.

4. Measurement Items a) The inner electrode was observed with an optical microscope (macrophotograph (50 times)). The number of observation points was set to four (bottom portion, body portion, bottle mouth portion, and exhaust manifold portion). The number of observations was set to five (initial state-first day (501 times)-second day (2000 times)-third day (4500 times)-fourth day (7000 times)).

b) A surface resistance value of the inner electrode was measured. The number of measurement points was set to four (bottom portion, body portion, bottle mouth portion, and exhaust manifeold portion). The number of measurements was set to five (initial state-first day (501 times)-second day (2000 times)-third day (4500 times)-fourth day (7000 times)). In this case, because there is presence or absence of the film on a circumference of the measurement point, it is considered that the surface resistance value is an auxiliary value.

Figure 39:
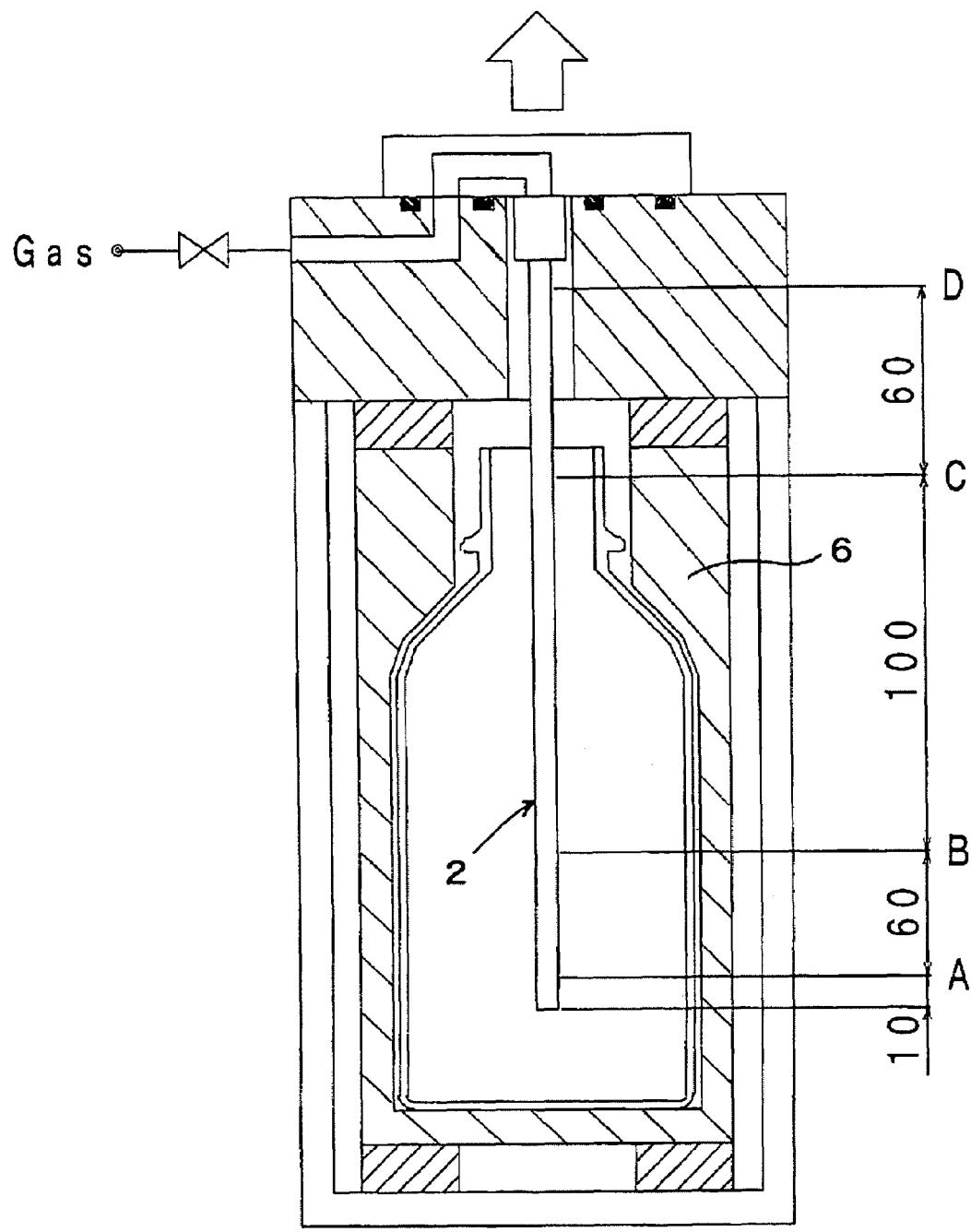
FIG. 39 is a view showing a position relationship among measurement points A, B, C, and D.

The measurement points A, B, C, and D in a) and b) were as follows: An A portion was set to the bottom portion (located 10 mm above a leading end of the inner electrode). At this point, the leading end of the inner electrode was set 25 mm above a bottom electrode. B portion was set to the body portion (located 60 mm above the A portion). C portion was set to the bottle mouth portion (located 100 mm above the B portion). D portion was set to the exhaust manifold portion (located 60 mm above the C portion). FIG. 39 shows a position relationship among the measurement points.

c) Measurement of Reflected Wave

High-frequency output was 400 W, deposition time was 3.0 seconds, and measurements were performed at 1 batch, 100 batches, . . . , 7000 batches.

d) Bottle Sampling

Barrier properties measurement samplings were obtained from 1 batch, 500 batches, . . . , 7000 batches. Film thickness visual inspection samplings were obtained from 1 batch, 100 batches, . . . , 7000 batches.

Figure 3:
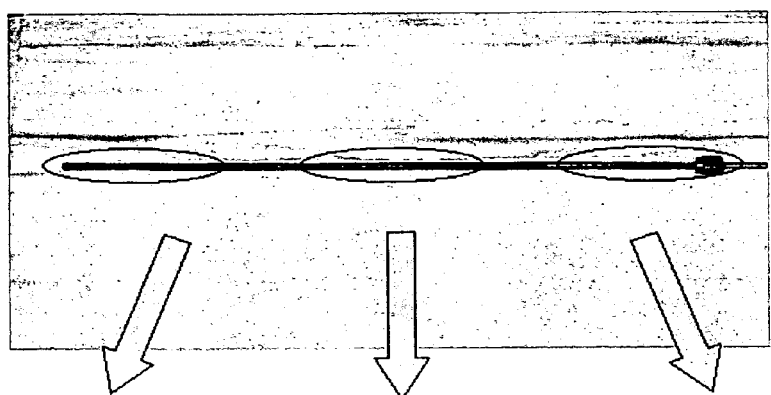
FIG. 3 is an inner electrode photograph after 500 batches performed by an inside chamber compressed air blow method showing an embodiment of the invention are completed.
Figure 4:
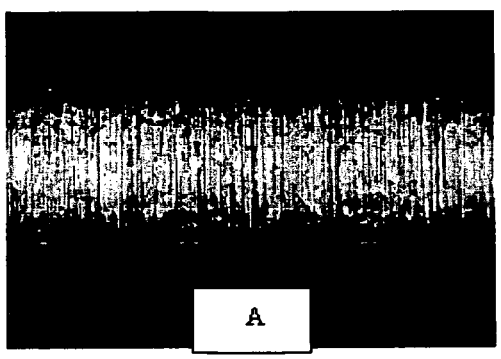
FIG. 4 shows an A part of an inner electrode bottom portion macrophotograph (50 times) after 500 batches are completed.
Figure 5:
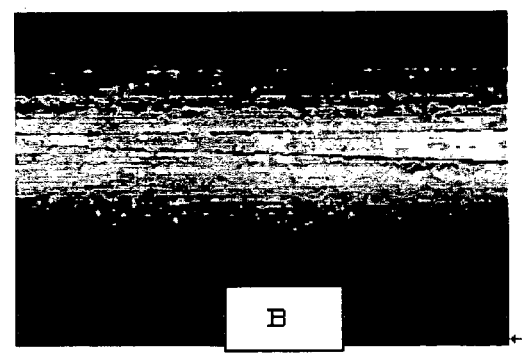
FIG. 5 shows a B part of an inner electrode body portion macrophotograph (50 times) after 500 batches are completed.
Figure 6:
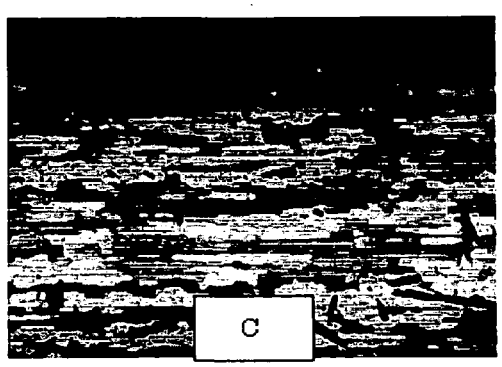
FIG. 6 shows a C part of an inner electrode bottle mouth portion macrophotograph (50 times) after 500 batches are completed.
Figure 7:
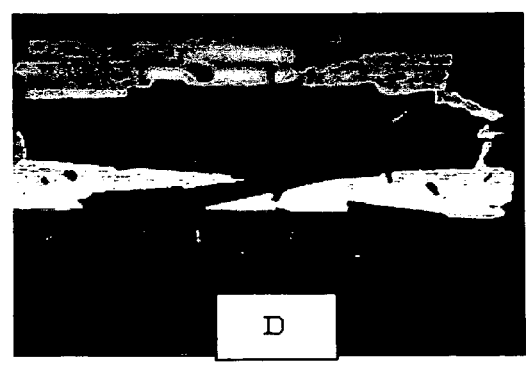
FIG. 7 shows a D part of an inner electrode exhaust manifold portion macrophotograph (50 times) after 500 batches are completed.

5. Experimental Result a) Observation of Inner Electrode with Optical Microscope The optical microscope observation results after the completion of 500 batches were as follows: FIG. 3 shows an inner electrode photograph after the completion of 500 batches, FIG. 4 shows the A part of an inner electrode bottom portion macrophotograph (50 times) after the completion of 500 batches, FIG. 5 shows the B part of an inner electrode body portion macrophotograph (50 times) after the completion of 500 batches, FIG. 6 shows the C part of an inner electrode bottle mouth portion macrophotograph (50 times) after the completion of 500 batches, and FIG. 7 shows the D part of an inner electrode exhaust manifold portion macrophotograph (50 times) after the completion of 500 batches.

The optical microscope observation results after the completion of 2000 batches were as follows: FIG. 8 shows the inner electrode photograph after the completion of 2000 batches, FIG. 9 shows the A part of the inner electrode bottom portion macrophotograph (50 times) after the completion of 2000 batches, FIG. 10 shows the B part of the inner electrode body portion macrophotograph (50 times) after the completion of 2000 batches, FIG. 11 shows the C part of the inner electrode bottle mouth portion macrophotograph (50 times) after the completion of 2000 batches, and FIG. 12 shows the D part of the inner electrode exhaust manifold portion macrophotograph (50 times) after the completion of 2000 batches.

The optical microscope observation results after the completion of 4500 batches were as follows: FIG. 13 shows the inner electrode photograph, FIG. 14 shows the A part of the inner electrode bottom portion macrophotograph (50 times) after the completion of 4500 batches, FIG. 15 shows the B part of the inner electrode body portion macrophotograph (50 times) after the completion of 4500 batches, and FIG. 16 shows the C part of the inner electrode bottle mouth portion macrophotograph (50 times) after the completion of 4500 batches. In this case, the accompanying drawing of the D part of the inner electrode exhaust manifold portion macrophotograph (50 times) was lost because image data was broken.

Figure 17:
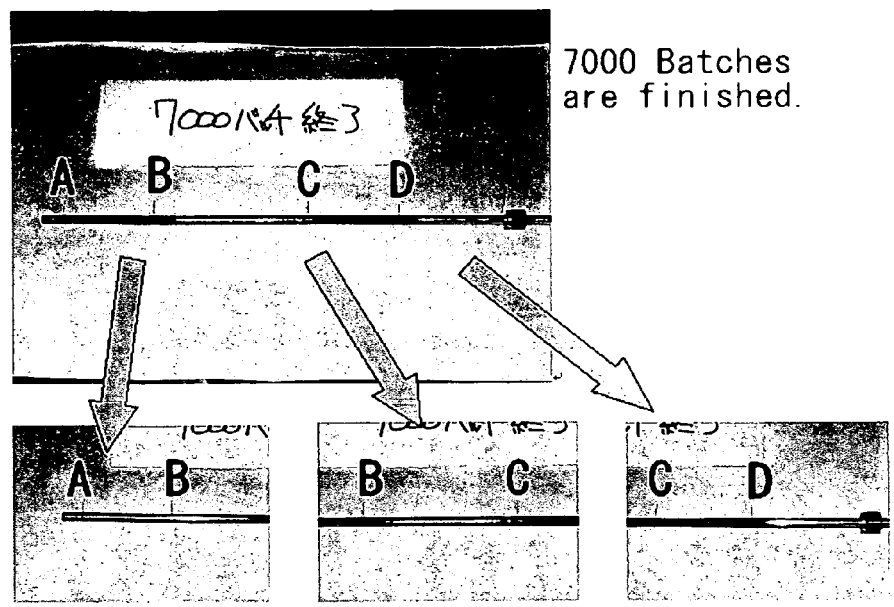
FIG. 17 shows the inner electrode photograph after 7000 batches are completed.
Figure 18:
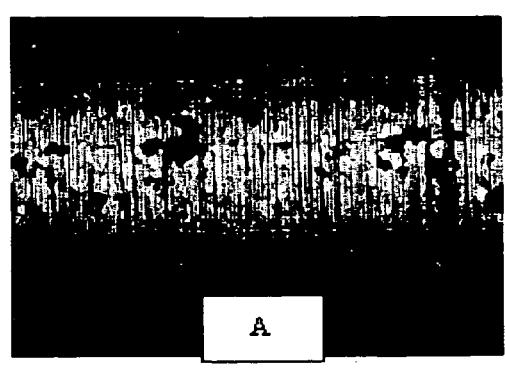
FIG. 18 shows the A part of the inner electrode bottom portion macrophotograph (50 times) after 7000 batches are completed.
Figure 19:
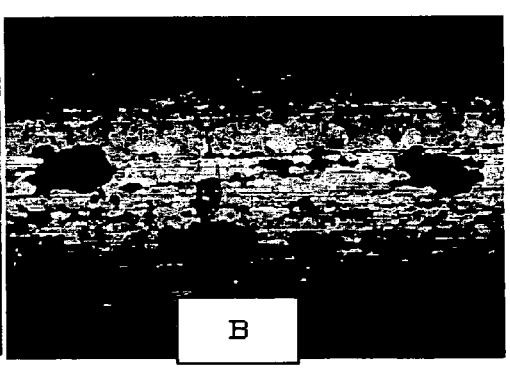
FIG. 19 shows the B part of the inner electrode body portion macrophotograph (50 times) after 7000 batches are completed.
Figure 20:
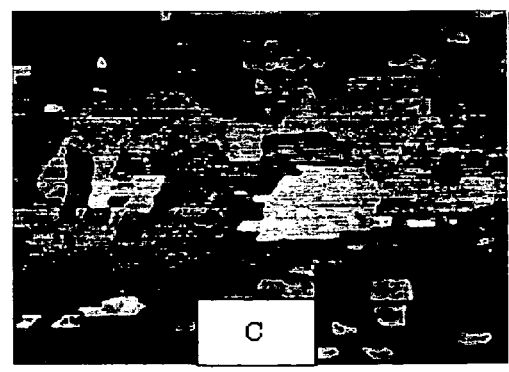
FIG. 20 shows the C part of the inner electrode bottle mouth portion macrophotograph (50 times) after 7000 batches are completed.
Figure 21:
FIG. 21 shows the D part of the inner electrode exhaust manifold portion macrophotograph (50 times) after 7000 batches are completed.

The optical microscope observation results after the completion of 7000 batches were as follows: FIG. 17 shows the inner electrode photograph after the completion of 7000 batches, FIG. 18 shows the A part of the inner electrode bottom portion macrophotograph (50 times) after the completion of 7000 batches, FIG. 19 shows the B part of the inner electrode body portion macrophotograph (50 times) after the completion of 7000 batches, FIG. 20 shows the C part of the inner electrode bottle mouth portion macrophotograph (50 times) after the completion of 7000 batches, and FIG. 21 shows the D part of the inner electrode exhaust manifold portion macrophotograph (50 times) after the completion of 7000 batches.

b) Measurement of Surface Resistance Value of Inner Electrode

Table 1 shows the surface resistance value.

c) Measurement of Reflected Wave

Table 2 shows the measurement value of the reflected wave. Table 2 shows that the plasma is stably generated as the reflected wave is decreased.

TABLE 1

| Measurement Date (batch) | Bottom Portion (Ω) | Body Portion (Ω) | Bottle Mouth portion (Ω) | Exhaust manifold (Ω) |
|---|---|---|---|---|
| First Day (1 batch) | 0~0.2 | 0~0.2 | 0~0.2 | 0~0.2 |
| Second Day (501 batch) | 0~0.2 | 0~0.5 | 4.5M | ∞ |
| Third Day (4500 batch) | 0~0.2 | 0~0.1 | ∞ | ∞ |
| Fourth Day (7000 batch) | 0~0.4 | 0.5~1.2 | ∞ | ∞ |

TABLE 2

| The number of Batches | Reflected wave (w) |
|---|---|
| 1 | 4 |
| 100 | 5 |
| 200 | 5 |
| 300 | 5 |
| 400 | 5 |
| 500 | 5 |
| 600 | 4 |
| 700 | 5 |
| 800 | 4 |
| 900 | 4 |
| 1000 | 4 |
| 1100 | 5 |
| 1200 | 4 |
| 1300 | 5 |
| 1400 | 5 |
| 1500 | 5 |
| 1600 | 5 |
| 1700 | 5 |
| 1800 | 5 |
| 1900 | 5 |
| 2000 | 5 |
| 2100 | 5 |
| 2200 | 5 |
| 2300 | 5 |
| 2400 | 5 |
| 2500 | 5 |
| 2600 | 4 |
| 2700 | 5 |
| 2800 | 5 |
| 2900 | 5 |
| 3000 | 5 |
| 3100 | 5 |
| 3200 | 5 |
| 3300 | 5 |
| 3400 | 5 |
| 3500 | 5 |
| 3600 | 5 |
| 3700 | 5 |
| 3800 | 4 |
| 3900 | 4 |
| 4000 | 5 |
| 4100 | 4 |
| 4200 | 5 |
| 4300 | 5 |
| 4400 | 5 |
| 4500 | 5 |
| 4600 | 4 |
| 4700 | 5 |
| 4800 | 4 |
| 4900 | 5 |
| 5000 | 5 |
| 5100 | 5 |
| 5200 | 6 |
| 5300 | 6 |
| 5400 | 6 |
| 5500 | 7 |
| 5600 | 5 |

TABLE 2-continued

| The number of Batches | Reflected wave (w) |
|---|---|
| 5700 | 6 |
| 5800 | 5 |
| 5900 | 5 |
| 6000 | 4 |
| 6100 | 5 |
| 6200 | 7 |
| 6300 | 4 |
| 6400 | 5 |
| 6500 | 4 |
| 6600 | 5 |
| 6700 | 5 |
| 6800 | 5 |
| 6900 | 4 |
| 7000 | 4 | d) Bottle Sampling

When the visual inspection was performed to the film thickness visual inspection samplings (1 batch, 100 batches, . . . , 7000 batches), it was not perceived that there were variations in film thickness. When the barrier properties were measured for the barrier properties measurement samplings (1 batch and 7000 batches), there was no difference.

6. Summary a) Surface State of Inner Electrode (See Macrophotograph)

Form 500 batches until after the completion of 7000 batches, the large change was not observed in the adhesion state of the film. The film (contaminant) which adhered to the exhaust manifold portion and the bottle mouth portion in a concentrated manner was found. Density of the film (contaminant) was thin in the bottom portion and the body portion. The adhesion of the film (contaminant) was weak and easy to flake away in the exhaust manifold portion.

b) Surface Resistance Value of Inner Electrode

In the exhaust manifold portion and the bottle mouth portion, the surface was insulated before the number of discharges became larger. From the initial state until after the completion of 7000 batches, the large change was not observed in the bottom portion and the body portion.

c) Reflected Wave and Matching Point

From the initial state until after the completion of 7000 batches, the reflected wave was stable in the range of 4 to 7 W. The matching point was also stable from the initial state until after the completion of 7000 batches. The discharge state was also stable through the experiment (by visual confirmation from a viewport).

From the results of a), b), and c), the stable discharge and the stable deposition could be always performed until after the completion of 7000 batches.

The inner electrode cleaning evaluation experiment which is of another example of the invention will be described below. Cleaning Evaluation Experiment 2 of Source Gas Introduction Pipe which also Acts as Inner Electrode

[Outside Chamber Ultrasonic Air Blow Method]

Figure 22:
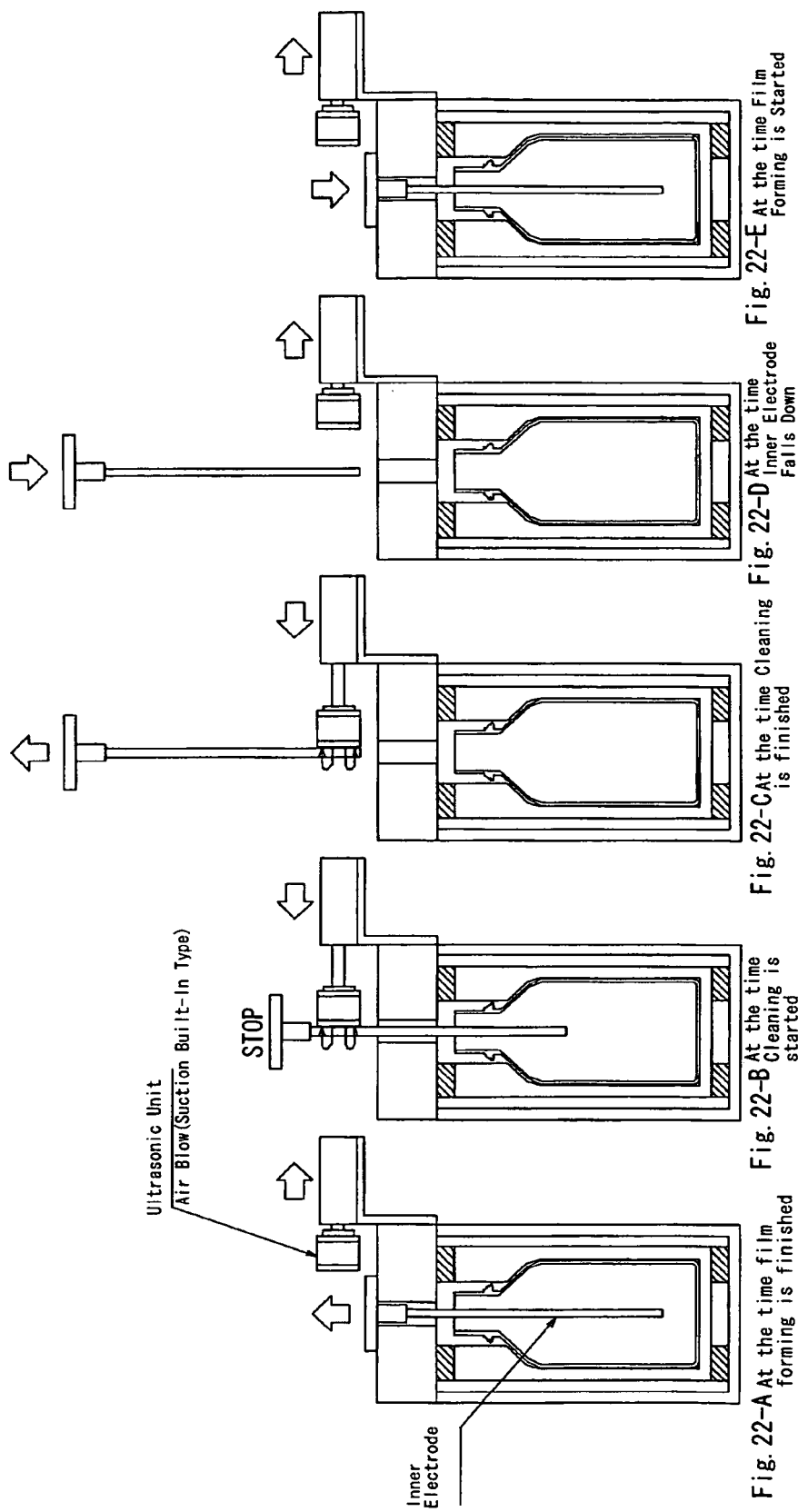
FIG. 22 is a schematic diagram showing an outside chamber ultrasonic air blow method which another mode of the device for cleaning the source gas introduction pipe used in the CVD apparatus according to the invention.

The experiment was performed with the apparatus shown in FIGS. 51 and 22. As shown in FIGS. 22A to 22E, the cleaning is performed (see FIG. 22B) after the completion of the deposition (see FIG. 22A). An ultrasonic unit (ultrasonic air blowing means) proceeds and the ultrasonic air is blown to the contaminant adhering to the inner electrode. The inner electrode is elevated and cleaned to the leading end (lowest position) of the inner electrode by the blow of the ultrasonic air (see FIG. 22C). The cleaning is performed while the inner electrode rises. The ultrasonic unit is retracted from the inner electrode while the inner electrode falls down from the uppermost position (see FIG. 22D). Finally the inner electrode falls down to be accommodated into the plastic container, and the deposition chamber becomes the sealed state (see FIG. 22E).

1. Deposition Process Conditions a) Evacuation System

The conditions were set in a manner similar to the inside chamber air blow method.

b) Gas Supply System

The conditions were set in a manner similar to the inside chamber air blow method.

c) RF (High Frequency) Supply System

The conditions were set in a manner similar to the inside chamber air blow method.

2. Cleaning Conditions a) Ultrasonic Air Blow System (Air Supply System)

The air supply pressure was set to 0.3 MPa, and the air supply flow rate was set to 160 1/min.

b) Suction and Exhaust System (Dust Exhaust System)

The exhaust flow rate was set to 180 1/min.

c) Frequency of Ultrasonic Wave

The frequency ranged from 20 KHz to 4 MHz. The example was performed at the frequency of 100 kHz.

d) Elevating Condition of Source Gas Introduction Pipe which also Acts as Inner Electrode In the cylinder elevating speed, the rise speed was set to about 0.7 second and the fall speed was set to about 0.9 second. The stroke length of the elevation was set to 295 mm.

3. Work (Inner Electrode Specifications)

The conditions were set in a manner similar to the inside chamber air blow method.

4. Measurement Items a) The Inner electrode was observed with the optical microscope in a manner similar to the inside chamber air blow method.

b) The surface resistance value of the inner electrode was measured. The conditions were set in a manner similar to the inside chamber air blow method.

c) Measurement of Reflected Wave

The high-frequency output was 400 W, the deposition time was 3.0 seconds, and the measurements were performed at 1 batch, 100 batches, . . . , 7000 batches.

d) Bottle Sampling

The conditions were set in a manner similar to the inside chamber air blow method.

Figure 23:
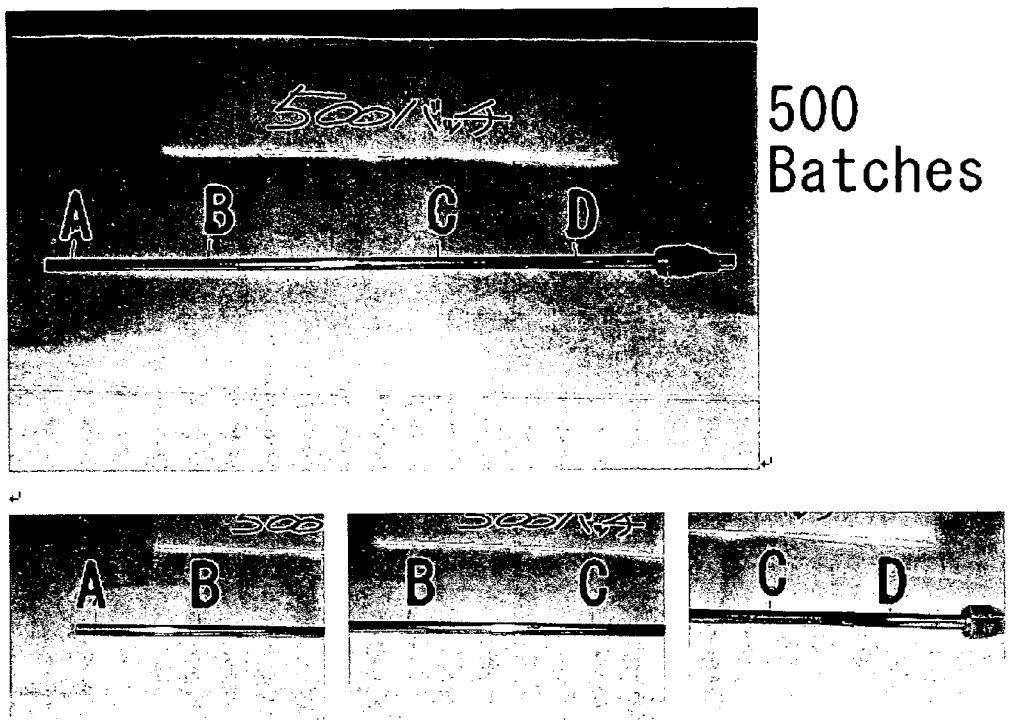
FIG. 23 is an inner electrode photograph after 500 batches performed by an outside chamber ultrasonic air blow method showing another embodiment of the invention are completed.

5. Experimental Result a) Observation of Inner Electrode with Optical Microscope The optical microscope observation results after the completion of 500 batches were as follows: FIG. 23 shows an inner electrode photograph after the completion of 500 batches. The macrophotographs of the A, B, C, and D portions are not attached.

Figure 24:
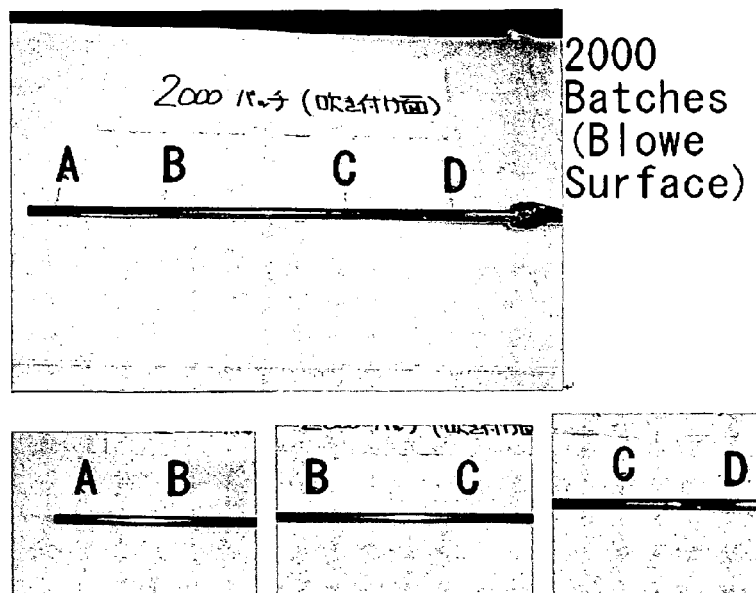
FIG. 24 shows an inner electrode photograph after 2000 batches are completed.
Figure 25:
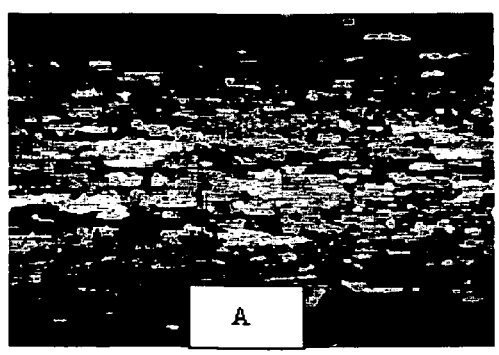
FIG. 25 shows an A part of an inner electrode bottom portion macrophotograph (50 times) after 2000 batches are completed.
Figure 26:
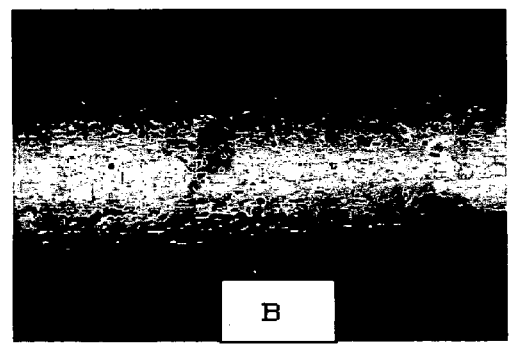
FIG. 26 shows a B part of an inner electrode body portion macrophotograph (50 times) after 2000 batches are completed.
Figure 27:
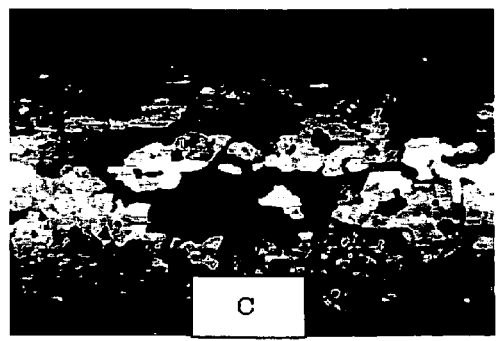
FIG. 27 shows a C part of an inner electrode bottle mouth portion macrophotograph (50 times) after 2000 batches are completed.
Figure 28:
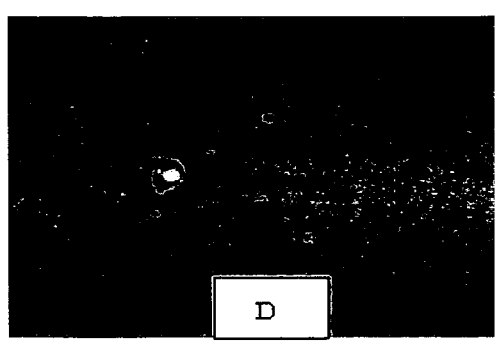
FIG. 28 shows a D part of an inner electrode exhaust manifold portion macrophotograph (50 times) after 2000 batches are completed.

The optical microscope observation results after the completion of 2000 batches were as follows: FIG. 24 shows the inner electrode photograph after the completion of 2000 batches, FIG. 25 shows the A part of the inner electrode bottom portion macrophotograph (50 times) after the completion of 2000 batches, FIG. 26 shows the B part of the inner electrode body portion macrophotograph (50 times) after the completion of 2000 batches, FIG. 27 shows the C part of the inner electrode bottle mouth portion macrophotograph (50 times), and FIG. 28 shows the D part of the inner electrode exhaust manifold portion macrophotograph (50 times) after the completion of 2000 batches.

The optical microscope observation results after the completion of 4500 batches were as follows: FIG. 29 shows the inner electrode photograph after the completion of 4500 batches, FIG. 30 shows the A part of the inner electrode bottom portion macrophotograph (50 times) after the completion of 4500 batches, FIG. 31 shows the B part of the inner electrode body portion macrophotograph (50 times) after the completion of 4500 batches, FIG. 32 shows the C part of the inner electrode bottle mouth portion macrophotograph (50 times) after the completion of 4500 batches, and FIG. 33 shows the D part of the inner electrode exhaust manifold portion macrophotograph (50 times) after the completion of 4500 batches.

Figure 34:
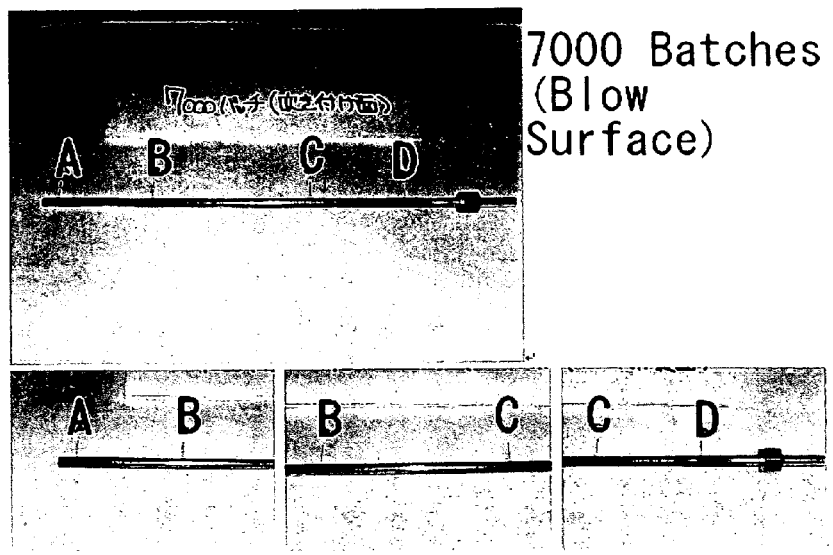
FIG. 34 shows the inner electrode photograph after 7000 batches are completed.
Figure 35:
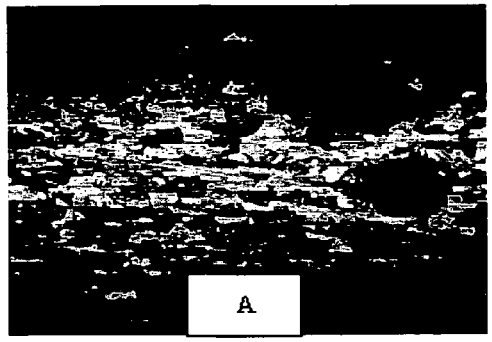
FIG. 35 shows the A part of the inner electrode bottom portion macrophotograph (50 times) after 7000 batches are completed.
Figure 36:
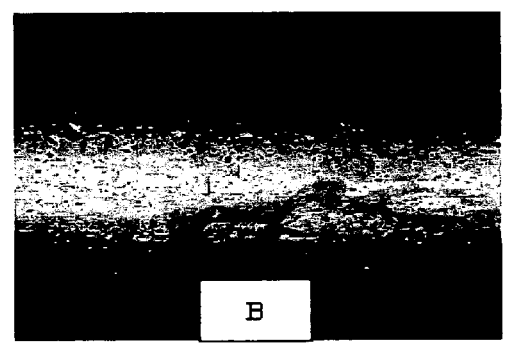
FIG. 36 shows the B part of the inner electrode body portion macrophotograph (50 times) after 7000 batches are completed.
Figure 37:
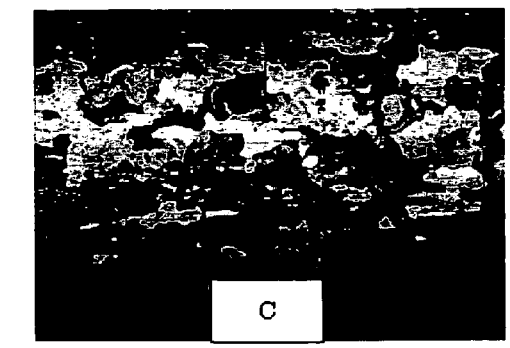
FIG. 37 shows the C part of the inner electrode bottle mouth portion macrophotograph (50 times) after 7000 batches are completed.
Figure 38:
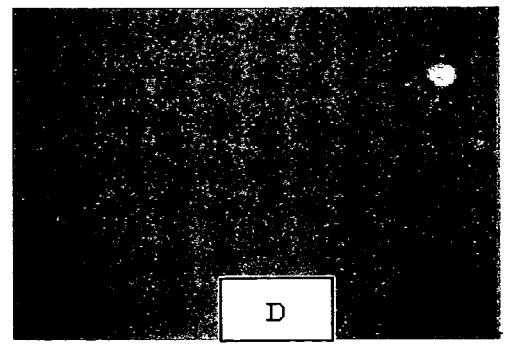
FIG. 38 shows the D part of the inner electrode exhaust manifold portion macrophotograph (50 times) after 7000 batches are completed.

The optical microscope observation results after the completion of 7000 batches were as follows: FIG. 34 shows the inner electrode photograph after the completion of 7000 batches, FIG. 35 shows the A part of the inner electrode bottom portion macrophotograph (50 times) after the completion of 7000 batches, FIG. 36 shows the B part of the inner electrode body portion macrophotograph (50 times) after the completion of 7000 batches, FIG. 37 shows the C part of the inner electrode bottle mouth portion macrophotograph (50 times) after the completion of 7000 batches, and FIG. 38 shows the D part of the inner electrode exhaust manifold portion macrophotograph (50 times) after the completion of 7000 batches.

b) Measurement of Surface Resistance Value of Inner Electrode

Table 3 shows the surface resistance value.

c) Reflected Wave

Table 4 shows the measurement value of the reflected wave.

d) Bottle Sampling

When the visual inspection was performed to the film thickness visual inspection samplings (1 batch, 100 batches, . . . , 7000 batches), it was not perceived that there were variations in film thickness. When the barrier properties were measured for the barrier properties measurement samplings (1 batch and 7000 batches), there was no difference.

TABLE 3

| Measurement date (batch) | Bottom Portion ($\Omega$) | Body Portion ($\Omega$) | Bottle Mouth Portion ($\Omega$) | Exhaust manifold ($\Omega$) |
|---|---|---|---|---|
| First Day (1 batch) | — | — | — | — |
| Second Day (501 batch) | 0.1 | 10~15 | 2.3~2.5 | ∞ |
| Third Day (4500 batch) | 0.3~0.4 | 8.1~9.0 | 66k | ∞ |
| Fourth Day (7000 batch) | 1.4 | 7.8 | 4.0M | ∞ |

TABLE 4

| The number of Batches | Reflected Wave (W) |
|---|---|
| 1 | 5 |
| 100 | 5 |
| 200 | 5 |
| 300 | 5 |
| 400 | 5 |
| 500 | 4 |
| 600 | 4 |
| 700 | 4 |
| 800 | 4 |
| 900 | 5 |
| 1000 | 4 |
| 1100 | 5 |
| 1200 | 5 |
| 1300 | 5 |
| 1400 | 5 |
| 1500 | 5 |
| 1600 | 5 |
| 1700 | 5 |
| 1800 | 4 |
| 1900 | 5 |
| 2000 | 5 |
| 2100 | 4 |
| 2200 | 5 |
| 2300 | 5 |
| 2400 | 5 |
| 2500 | 5 |
| 2600 | 4 |
| 2700 | 5 |
| 2800 | 5 |
| 2900 | 5 |
| 3000 | 5 |
| 3100 | 5 |
| 3200 | 5 |
| 3300 | 5 |
| 3400 | 5 |
| 3500 | 5 |
| 3600 | 5 |
| 3700 | 5 |
| 3800 | 5 |
| 3900 | 5 |
| 4000 | 5 |
| 4100 | 6 |
| 4200 | 5 |
| 4300 | 5 |
| 4400 | 5 |
| 4500 | 5 |
| 4600 | 5 |
| 4700 | 6 |
| 4800 | 5 |
| 4900 | 5 |
| 5000 | 6 |
| 5100 | 6 |
| 5200 | 5 |
| 5300 | 5 |
| 5400 | 5 |
| 5500 | 6 |
| 5600 | 5 |
| 5700 | 4 |
| 5800 | 5 |
| 5900 | 4 |
| 6000 | 5 |
| 6100 | 5 |
| 6200 | 5 |
| 6300 | 5 |
| 6400 | 5 |
| 6500 | 5 |
| 6600 | 4 |
| 6700 | 5 |
| 6800 | 5 |
| 6900 | 5 |
| 7000 | 5 |

6. Summary a) Surface State of Inner Electrode

In the bottom portion, the bottle mouth portion, and the exhaust manifold portion of the electrode, the amount of adhesion of the film (contaminant) was clearly increased because the ultrasonic air did not reach these portions. In the portion onto which the ultrasonic air impinged in the short range (5 mm), it was not perceived that there was the large difference between the ultrasonic air blow surface and the backside of the ultrasonic air blow surface in the amount of adhesion of the film (contaminant).

b) Measurement of Surface Resistance Value of Inner Electrode

The large change was not observed in the bottom portion and the body portion. In the bottle mouth portion and the exhaust manifold portion, the insulation state advanced every time the discharge was performed. Since the ultrasonic air did not impinge on the exhaust manifold portion and the bottle mouth portion at all, degradation advances significantly.

c) Reflected Wave and Matching Point

From the initial state until after the completion of 7000 batches, the reflected wave was stable in the range of 4 to 6 W. After the completion of about 4000 batches, it was recognized that the discharge became unstable (degree that discharge plasma slightly flickers by the visual observation of the plasma). At this point, the reflected wave also largely flickers like 9→25→6→5. The matching point was stable from the initial state until after the completion of 7000 batches.

COMPARATIVE EXAMPLE

The effect of the electrode cleaning was verified by examining the discharge status and the state of the electrode in the case where the inner electrode is not cleaned. The experiment was performed with the apparatus similar to the apparatus shown in FIG. 1 on condition that the cleaning device was not operated.

1. Deposition Process Conditions
   Table 5 shows the conditions.

TABLE 5

| a) Vacuum System | b) Gas Supply System | c) RF Supply System |
|---|---|---|
| Ultimate pressure: 6.65 Pa | Kind of Gas: $C_2H_2$ (acetylene) | RF output: 400 W |
| Deposition pressure: 26.6 Pa | Gas flow rate: 50 sccm | Frequency: 13.56 MHz |
|  | Gas stabilizing time: 1.0 sec | Discharge time: 3.0 sec |

Note:
these pressures were a degree of vacuum measured at the exhaust manifold

2. Work (Inner Electrode Specifications)

The conditions were set in a manner similar to the inside chamber air blow method.

3. Measurement Items
a) The inner electrode was observed with the optical microscope (inner electrode macrophotograph (50 times)). The number of observation points was set to four (bottom portion, body portion, bottle mouth portion, and exhaust manifold portion). However, the number of observations was set to two, i.e. 500 batches and 600 batches. Namely, the discharge could not be performed at 600 batches, so that 600 batches were set to the upper limit deposition time.

b) The surface resistance value of the inner electrode was measured. The number of measurement points was set to four (bottom portion, body portion, bottle mouth portion, and exhaust manifold portion). However, the number of measurements was set to two, i.e. 500 batches and 600 batches. Namely, the discharge could not be performed at 600 batches, so that 600 batches were set to the upper limit deposition time.

The measurement points A, B, C, and D in a) and b) were set in a manner similar to the inside chamber air blow method.

c) Measurement of Reflected Wave
The high-frequency output was 400 W, the deposition time was 3.0 seconds, and the measurements were performed at 1, 50, 100, . . . , 600 batches.

d) Bottle Sampling
The barrier properties measurement sampling was obtained from 1 batch and 500 batches. The film thickness visual inspection sampling was obtained from 1, 100, . . . , 500 batches.

4. Experimental Results
a) Observation of Inner Electrode with Optical Microscope
The optical microscope observation results after the completion of non-cleaning 500 batches were as follows: FIG. 40 shows the inner electrode photograph of Comparative Example after the completion of non-cleaning 500 batches, FIG. 41 shows the A part of the inner electrode bottom portion macrophotograph (50 times) of Comparative Example after the completion of non-cleaning 500 batches, FIG. 42 shows the B part of the inner electrode body portion macrophotograph (50 times) of Comparative Example after the completion of non-cleaning 500 batches, FIG. 43 shows the C part of the inner electrode bottle mouth portion macrophotograph (50 times) of Comparative Example after the completion of non-cleaning 500 batches, and FIG. 44 shows the D part of the inner electrode exhaust manifold portion macrophotograph (50 times) of Comparative Example after the completion of non-cleaning 500 batches.

Figure 45:
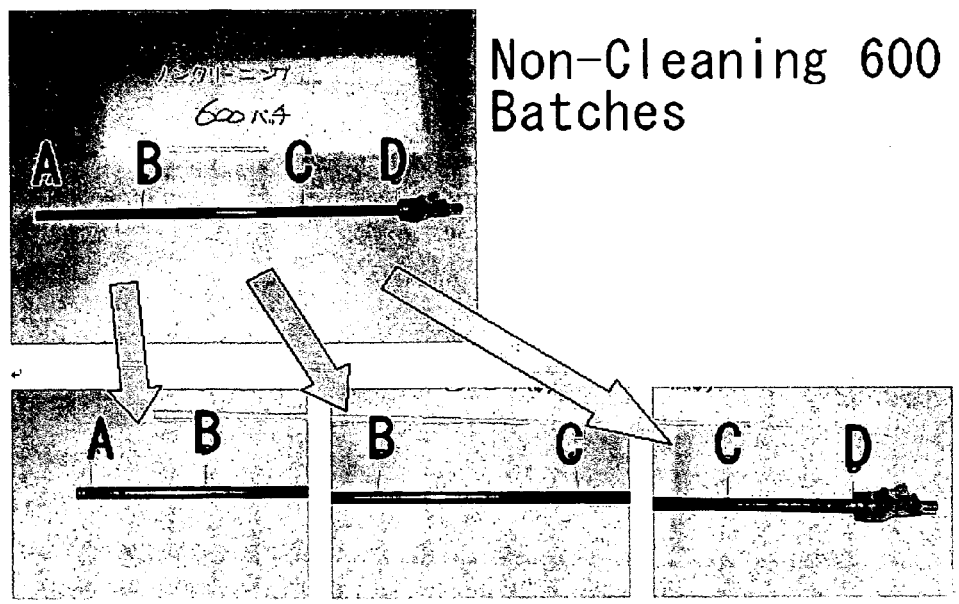
FIG. 45 shows the inner electrode photograph of the comparative example after 600 batches are completed.
Figure 46:
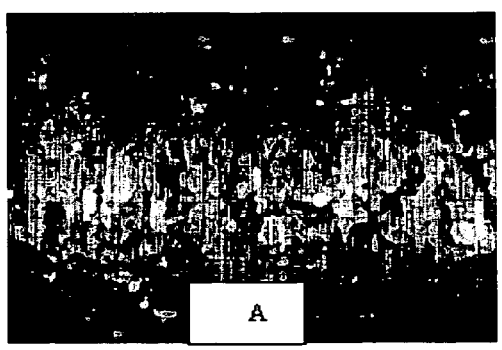
FIG. 46 shows the A part of the inner electrode bottom portion macrophotograph (50 times) of the comparative example after 600 batches are completed.
Figure 47:
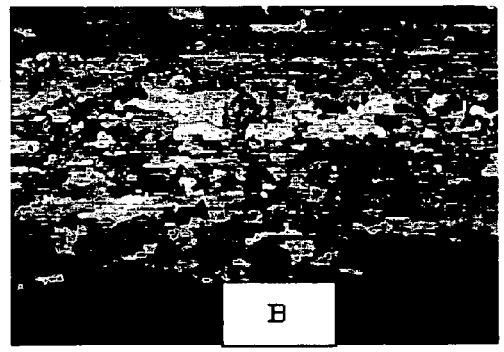
FIG. 47 shows the B part of the inner electrode body portion macrophotograph (50 times) of the comparative example after 600 batches are completed.
Figure 48:
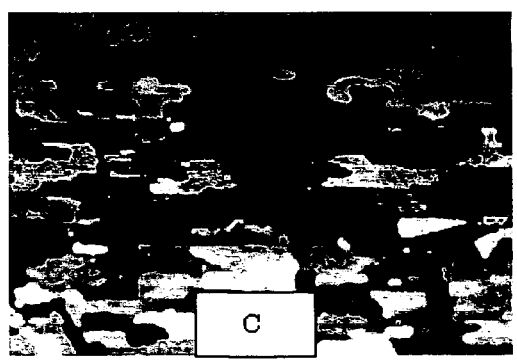
FIG. 48 shows the C part of the inner electrode bottle mouth portion macrophotograph (50 times) of the comparative example after 600 batches are completed.
Figure 49:
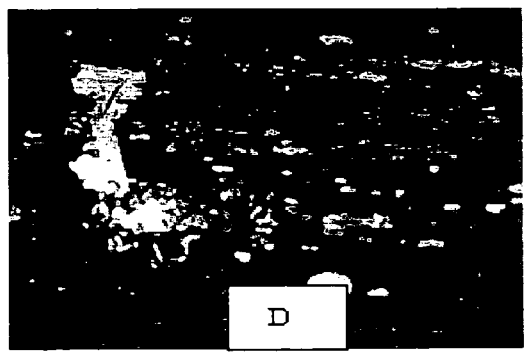
FIG. 49 shows the D part of the inner electrode exhaust manifold portion macrophotograph (50 times) of the comparative example after 600 batches are completed.

The optical microscope observation results after the completion of non-cleaning 600 batches were as follows: FIG. 45 shows the inner electrode photograph of Comparative Example after the completion of non-cleaning 600 batches, FIG. 46 shows the A part of the inner electrode bottom portion macrophotograph (50 times) of Comparative Example after the completion of non-cleaning 600 batches, FIG. 47 shows the B part of the inner electrode body portion macrophotograph (50 times) of Comparative Example after the completion of non-cleaning 600 batches, FIG. 48 shows the C part of the inner electrode bottle mouth portion macrophotograph (50 times) of Comparative Example after the completion of non-cleaning 600 batches, and FIG. 49 shows the D part of the inner electrode exhaust manifold portion macrophotograph (50 times) of Comparative Example after the completion of non-cleaning 600 batches.

b) Measurement of Surface Resistance Value of Inner Electrode
Table 6 shows the surface resistance value.

c) Reflected Wave
Table 7 shows the measurement value of the reflected wave.

d) Bottle Sampling

When the barrier properties were measured for the barrier properties measurement samplings (1 batch and 500 batches), there was no difference. When the visual inspection was performed to the film thickness visual inspection samplings (1, 100, . . . , 500 batches), it was not perceived that there were variations in film thickness.

5. Summary a) Surface State of Inner Electrode

The many films (contaminant) which adhered at the time when 500 batches were completed was found. The film (contaminant) which adhered to the exhaust manifold portion and the bottle mouth portion in a concentrated manner was found.

b) Measurement of Surface Resistance Value of Inner Electrode

In the C portion (bottle mouth portion) and the D portion (manifold portion), the electrical resistance showed the large value at the time when 500 batches were completed. In the electrode in which the discharge could not be performed after the completion of 600 batches, all the points A, B, C, and, D were insulated.

c) Reflected Wave and Matching Point

Until after the completion of 50 batches, the reflected wave was stable in the range of 4 to 6 W. After the completion of 100 batches, it was recognized that the reflected wave was disturbed. After the completion of 300 batches, the ratio of the disturbance of the reflected wave was increased (about 80%). The discharge could not be performed at the time when the depositions of about 600 batches were completed. When the electrode was changed to the new one, since the stable discharge occurred, it can be assumed that the film (contaminant) which adheres to the electrode causes the disturbance of the discharge.

When the inside chamber air blow method (Embodiment 1) and the outside chamber ultrasonic air blow method (Embodiment 2) were compared with the non-cleaning (Comparative Example), the advantage of the inner electrode cleaning according to the embodiments could be confirmed.

TABLE 6

Surface resestance value

| (Batch) | Bottom Portion ($\Omega$) | Body Portion ($\Omega$) | Bottle Mouth Portion ($\Omega$) | Exhaust manifold ($\Omega$) |
|---|---|---|---|---|
| 500 | 0.03 | 0.05 | 9.7M | 7.47M |
| 600 | $\infty$ | $\infty$ | $\infty$ | $\infty$ |

TABLE 7

Reflected wave

| | Reflected Wave (W) | Ultimate pressure (Pa) | Deposition pressure (Pa) | TUNE LOAD | Remark |
|---|---|---|---|---|---|
| 1 | 5 | 7.51 | 11.09 | 7.0 / 6.2 | The reflected wave is stable in the range of 4 to 6 W |
| 50 | 5 | 5.31 | 8.27 | 7.0 / 6.3 | |
| 100 | 7 | 9.08 | 10.51 | 7.0 / 6.2 | |
| 150 | 5 | 7.65 | 9.51 | 7.0 / 6.1 | The reflected wave ranging from 20 to 40 W is momentarily |
| 200 | 3 | 9.03 | 10.95 | 7.0 / 6.1 | |
| 250 | 5 | 9.11 | 9.44 | 7.0 / 6.3 | |
| 300 | 7 | 9.22 | 11.23 | 7.0 / 6.2 | |
| 350 | 7 | 9.31 | 10.17 | 7.0 / 6.4 | |
| 400 | 7 | 9.34 | 10.63 | 7.0 / 6.4 | The disturbance of the reflected wave is increased (about 80% of the whole reflected wave) |
| 450 | 7 | 8.13 | 9.64 | 7.0 / 6.4 | |
| 500 | 7 | 10.36 | 10.68 | 7.0 / 6.4 | |
| 550 | 6 | 6.34 | 10.85 | 7.0 / 6.2 | |
| 600 | 91~106 | 6.96 | 8.99 | 7.0 / 9.1 | The discharge can not be performed |

The invention claimed is:

1. A method for cleaning a source gas introduction pipe used in a CVD apparatus, the source gas introduction pipe having an outer surface having contaminant adhering thereto, the contaminant mainly containing carbon powder and being formed during processes in which a plastic container is accommodated into a sealable deposition chamber having a function of an outer electrode, source gas is introduced from the source gas introduction pipe which is elevatably inserted into the plastic container and acts as an inner electrode, and the source gas is excited into plasma to form a CVD film on an inner surface of the plastic container, comprising:

extracting the source gas introduction pipe from the plastic container after the CVD film is formed on the inner surface of the plastic container;

spraying compressed air toward the outer surface of the source gas introduction pipe so as to remove the contaminant adhering to the outer surface; and sucking removed contaminant to exhaust the removed contaminant outside a system of the deposition chamber and to prevent the removed contaminant from being transferred to sides of the deposition chamber and the plastic container in which the CVD film is formed.

2. The method for cleaning a source gas introduction pipe used in a CVD apparatus according to claim 1, wherein the compressed air is sprayed toward the outer surface in a centripetal direction of the source gas introduction pipe from a compressed air spray portion provided in an upper portion of the deposition chamber or at a position above the deposition chamber.

3. The method for cleaning a source gas introduction pipe used in a CVD apparatus according to either one of claims 1 or 2, wherein the compressed air and the contaminant are sucked and removed into a suction and exhaust portion provided at a position above the spray portion by the sucking.

4. The method for cleaning a source gas introduction pipe used in a CVD apparatus according to claim 3, wherein an amount of suction and exhaust by the sucking is larger than an amount of air supply of the compressed air.

5. The method for cleaning a source gas introduction pipe used in a CVD apparatus according to claim 3, wherein deposition of the CVD film is separately performed in a plurality of deposition chambers positioned in a circle on a turntable, the contaminant mainly containing the carbon powder which adheres to the outer surface of the source gas introduction pipe is removed by spraying the compressed air in the process of extracting the source gas introduction pipe from the plastic container, and the process of sucking and exhausting the removed contaminant outside the system of the deposition chamber is completed, while the turntable is rotated one turn.

6. The method for cleaning a source gas introduction pipe used in a CVD apparatus according to claim 1, wherein the compressed air spray portion is provided in the upper portion of the deposition chamber or at the position above the deposition chamber, a suction and exhaust portion is provided at a position above the spray portion, a second compressed air spray portion is provided at a position above the suction and exhaust portion, the spray portion sprays the compressed air from the bottom toward the top, the second spray portion sprays the compressed air from the top toward the bottom, and the suction and exhaust portion sucks and removes the compressed air and the contaminant.

7. The method for cleaning a source gas introduction pipe used in a CVD apparatus according to any one of claims 1, 2, or 6, wherein an amount of suction and exhaust by the sucking is larger than an amount of air supply of the compressed air.

8. The method for cleaning a source gas introduction pipe used in a CVD apparatus according to claim 7, wherein deposition of the CVD film is separately performed in a plurality of deposition chambers positioned in a circle on a turntable, the contaminant mainly containing the carbon powder which adheres to the outer surface of the source gas introduction pipe is removed by spraying the compressed air in the process of extracting the source gas introduction pipe from the plastic container, and the process of sucking and exhausting the removed contaminant outside the system of the deposition chamber is completed, while the turntable is rotated one turn.

9. The method for cleaning a source gas introduction pipe used in a CVD apparatus according to any one of claims 1, 2, or 6, wherein deposition of the CVD film is separately performed in a plurality of deposition chambers positioned in a circle on a turntable, the contaminant mainly containing the carbon powder which adheres to the outer surface of the source gas introduction pipe is removed by spraying the compressed air in the process of extracting the source gas introduction pipe from the plastic container, and the process of sucking and exhausting the removed contaminant outside the system of the deposition chamber is completed, while the turntable is rotated one turn.

10. A method for cleaning a source gas introduction pipe used in a CVD apparatus, the source gas introduction pipe having an outer surface having contaminant adhering thereto, the contaminant mainly containing carbon powder and being formed during processes in which a plastic container is accommodated into a sealable deposition chamber having a function of an outer electrode, source gas is introduced from the source gas introduction pipe which is elevatably inserted into the plastic container and acts as an inner electrode, and the source gas is excited into plasma to form a CVD film on an inner surface of the plastic container, comprising:
  extracting the source gas introduction pipe from the plastic container after the CVD film is formed on the inner surface of the plastic container;
  blowing ultrasonic air toward the outer surface of the source gas introduction pipe so as to remove the contaminant adhering to the outer surface; and
  sucking removed contaminant to exhaust the removed contaminant outside a system of the deposition chamber and to prevent the removed contaminant from being transferred to sides of the deposition chamber and the plastic container in which the CVD film is formed.

11. The method for cleaning a source gas introduction pipe used in a CVD apparatus according to claim 10, wherein the ultrasonic air is blown toward the outer surface in a centripetal direction of the source gas introduction pipe from an ultrasonic air blow portion provided in an upper portion of the deposition chamber or at a position above the deposition chamber.

12. The method for cleaning a source gas introduction pipe used in a CVD apparatus according to either one of claims 10 or 11, wherein the ultrasonic air and the contaminant are sucked and removed into a suction and exhaust portion provided at a position above the blow portion by the sucking.

13. The method for cleaning a source gas introduction pipe used in a CVD apparatus according to claim 12, wherein an amount of suction and exhaust by the sucking is larger than an amount of air supply of the ultrasonic air.

14. The method for cleaning a source gas introduction pipe used in a CVD apparatus according to claim 13, wherein deposition of the CVD film is separately performed in a plurality of deposition chambers positioned in a circle on a turntable, the contaminant mainly containing the carbon powder which adheres to the outer surface of the source gas introduction pipe is removed by blowing the ultrasonic air in the process of extracting the source gas introduction pipe from the plastic container, and the process of sucking and exhausting the removed contaminant outside the system of the deposition chamber is completed, while the turntable is rotated one turn.

15. The method for cleaning a source gas introduction pipe used in a CVD apparatus according to claim 12, wherein deposition of the CVD film is separately performed in a plurality of deposition chambers positioned in a circle on a turntable, the contaminant mainly containing the carbon powder which adheres to the outer surface of the source gas introduction pipe is removed by blowing the ultrasonic air in the process of extracting the source gas introduction pipe from the plastic container, and the process of sucking and exhausting the removed contaminant outside the system of the deposition chamber is completed, while the turntable is rotated one turn.

16. The method for cleaning a source gas introduction pipe used in a CVD apparatus according to claim 10, wherein the ultrasonic air blow portion is provided in the upper portion of the deposition chamber or at the position above the deposition chamber, a suction and exhaust portion is provided at a position above the blow portion, a second ultrasonic air blow portion is provided at a position above the suction and exhaust portion, the blow portion blows the ultrasonic air from the bottom toward the top and the second blow portion blows the ultrasonic air from the top toward the bottom, and the suction and exhaust portion sucks and removes the ultrasonic air and the contaminant.

17. The method for cleaning a source gas introduction pipe used in a CVD apparatus according to any one of claims 10, 11, or 16, wherein an amount of suction and exhaust by the sucking is larger than an amount of air supply of the ultrasonic air.

18. The method for cleaning a source gas introduction pipe used in a CVD apparatus according to claim 17, wherein deposition of the CVD film is separately performed in a plurality of deposition chambers positioned in a circle on a turntable, the contaminant mainly containing the carbon powder which adheres to the outer surface of the source gas introduction pipe is removed by blowing the ultrasonic air in the process of extracting the source gas introduction pipe from the plastic container, and the process of sucking and exhausting the removed contaminant outside the system of the deposition chamber is completed, while the turntable is rotated one turn.

19. The method for cleaning a source gas introduction pipe used in a CVD apparatus according to any one of claims 10 11, or 16, wherein deposition of the CVD film is separately performed in a plurality of deposition chambers positioned in a circle on a turntable, the contaminant mainly containing the carbon powder which adheres to the outer surface of the source gas introduction pipe is removed by blowing the ultrasonic air in the process of extracting the source gas introduction pipe from the plastic container, and the process of sucking and exhausting the removed contaminant outside the system of the deposition chamber is completed, while the turntable is rotated one turn.

20. An apparatus for cleaning a source gas introduction pipe used in a CVD apparatus, the source gas introduction pipe having an outer surface having contaminant adhering thereto, the contaminant mainly containing carbon powder and being formed during processes in which a plastic container is accommodated into a sealable deposition chamber having a function of an outer electrode, source gas is introduced from the source gas introduction pipe which is elevatably inserted into the plastic container and acts as an inner electrode, and the source gas is excited into plasma to form a CVD film on an inner surface of the plastic container, comprising:
  source gas introduction pipe extracting means for extracting the source gas introduction pipe from the plastic container after a formation of the CVD film on the inner surface of the plastic container;
  compressed air spraying means for spraying compressed air toward the outer surface of the source gas introduction pipe having the contaminant adhering thereto; and
  suction and exhausting means for exhausting the contaminant removed by spraying the compressed air outside a system of the deposition chamber so as to prevent the contaminant from being transferred to sides of the deposition chamber and the plastic container in which the CVD film is formed.

21. The apparatus for cleaning a source gas introduction pipe used in a CVD apparatus according to claim 20, wherein a spray portion of the compressed air sprayed by the compressed air spraying means is provided around the outside of the source gas introduction pipe and in an upper portion of the deposition chamber or at a position above the deposition chamber.

22. The apparatus for cleaning a source gas introduction pipe used in a CVD apparatus according to either one of claims 20 or 21, wherein a suction and exhaust portion for sucking and removing the compressed air and the contaminant is provided around the outside of the source gas introduction pipe and at a position above the spray portion.

23. The apparatus for cleaning a source gas introduction pipe according to claim 22, wherein a substrate material used for the source gas introduction pipe is made of SUS 304 or SUS 316 whose surface is polished or a material in which SUS 304 or SUS 316 is coated with hard gold plating film acid type bath including one of 99.7Au-0.3Co and 99.8Au-0.2Ni for surface treatment.

24. The apparatus for cleaning a source gas introduction pipe used in a CVD apparatus according to claim 20, wherein the spray portion of the compressed air sprayed by the compressed air spraying means is provided around the outside of the source gas introduction pipe and in the upper portion of the deposition chamber or at the position above the deposition chamber, a suction and exhaust portion for sucking and removing the compressed air and the contaminant is provided around the outside of the source gas introduction pipe and at a position above the spray portion, a second spray portion of the compressed air sprayed by the compressed air spraying means is provided around the outside of the source gas introduction pipe and at the position above the suction and exhaust portion, a compressed air spray direction of the spray portion is orientated upward, and the compressed air spray direction of the second spray portion is orientated downward.

25. An apparatus for cleaning a source gas introduction pipe used in a CVD apparatus, the source gas introduction pipe having an outer surface having contaminant adhering thereto, the contaminant mainly containing carbon powder and being formed during processes in which a plastic container is accommodated into a sealable deposition chamber having a function of an outer electrode, source gas is introduced from the source gas introduction pipe which is elevatably inserted into the plastic container and acts as an inner electrode, and the source gas is excited into plasma to form a CVD film on an inner surface of the plastic container, comprising:
  source gas introduction pipe extracting means for extracting the source gas introduction pipe from the plastic container after a formation of the CVD film on the inner surface of the plastic container;
  ultrasonic air blowing means for blowing ultrasonic air toward the outer surface of the source gas introduction pipe having the contaminant adhering thereto; and
  suction and exhausting means for exhausting the contaminant removed by blowing the ultrasonic air outside a system of the deposition chamber so as to prevent the contaminant from being transferred to sides of the deposition chamber and the plastic container in which the CVD film is formed.

26. The apparatus for cleaning a source gas introduction pipe used in a CVD apparatus according to claim 25, wherein a blow portion of the ultrasonic air blown by the ultrasonic air blowing means is provided in an upper portion of the deposition chamber or at a position above the deposition chamber.

27. The apparatus for cleaning a source gas introduction pipe used in a CVD apparatus according to either one of claims 25 or 26, wherein a suction and exhaust portion for sucking and removing the ultrasonic air and the contaminant is provided at a position above the blow portion.

28. The apparatus for cleaning a source gas introduction pipe according to claim 27, wherein a substrate material used for the source gas introduction pipe is made of SUS 304 or SUS 316 whose surface is polished or a material in which SUS 304 or SUS 316 is coated with hard gold plating film acid type bath including one of 99.7Au-0.3Co and 99.8Au-0.2Ni for surface treatment.

29. The apparatus for cleaning a source gas introduction pipe used in a CVD apparatus according to claim 25, wherein the blow portion of the ultrasonic air blown by the ultrasonic air blowing means is provided in the upper portion of the deposition chamber or at the position above the deposition chamber, a suction and exhaust portion for sucking and removing the ultrasonic air and the contaminant is provided at a position above the blow portion, a second blow portion of the ultrasonic air blown by the ultrasonic air blowing means is provided at the position above the suction and exhaust portion, an ultrasonic air blow direction of the blow portion is orientated upward, and the ultrasonic air blow direction of the second blow portion is orientated downward.

30. A method for cleaning a source gas introduction pipe used in a CVD apparatus, the source gas introduction pipe having contaminant adhering thereto, the contaminant mainly containing carbon powder and being formed during processes in which a plastic container is accommodated into a sealable deposition chamber having a function of an outer electrode, source gas is introduced from the source gas introduction pipe which is elevatably inserted into the plastic container, and the source gas is excited into plasma with a micro wave to form a CVD film on an inner surface of the plastic container, comprising:
    extracting the source gas introduction pipe from the plastic container after the CVD film is formed on the inner surface of the plastic container;
    applying one of compressed air and ultrasonic air toward the outer surface of the source gas introduction pipe to remove the contaminant adhering to the outer surface;
    sucking removed contaminant to exhaust the removed contaminant outside a system of the deposition chamber so as to prevent the removed contaminant from being transferred to sides of the deposition chamber and the plastic container in which the CVD film is formed.

31. An apparatus for cleaning a source gas introduction pipe used in a CVD apparatus, the source gas introduction pipe having contaminant adhering thereto, the contaminant mainly containing carbon powder and being formed during processes in which a plastic container is accommodated into a sealable deposition chamber having a function of an outer electrode, source gas is introduced from the source gas introduction pipe which is elevatably inserted into the plastic container, and the source gas is excited into plasma with a micro wave to form a CVD film on an inner surface of the plastic container, comprising:
    source gas introduction pipe extracting means for extracting the source gas introduction pipe from the plastic container after a formation of the CVD film on the inner surface of the plastic container;
    compressed air spraying means for spraying compressed air toward the outer surface of the source gas introduction pipe having the contaminant adhering thereto; and
    suction and exhausting means for exhausting the contaminant removed by spraying the compressed air outside a system of the deposition chamber so as to prevent the contaminant from being transferred to sides of the deposition chamber and the plastic container in which the CVD film is formed.

32. An apparatus for cleaning a source gas introduction pipe used in a CVD apparatus, the source gas introduction pipe having an outer surface having contaminant adhering thereto, the contaminant mainly containing carbon powder and being formed during processes in which a plastic container is accommodated into a sealable deposition chamber having a function of an outer electrode, source gas is introduced from the source gas introduction pipe which is elevatably inserted into the plastic container, and the source gas is excited into plasma with a micro wave to form a CVD film on an inner surface of the plastic container, comprising:
    source gas introduction pipe extracting means for extracting the source gas introduction pipe from the plastic container after a formation of the CVD film on the inner surface of the plastic container;
    ultrasonic air blowing means for blowing ultrasonic air toward the outer surface of the source gas introduction pipe having the contaminant adhering thereto; and
    suction and exhausting means for exhausting the contaminant removed by blowing the ultrasonic air outside a system of the deposition chamber so as to prevent the contaminant from being transferred to sides of the deposition chamber and the plastic container in which the CVD film is formed.

33. The apparatus for cleaning a source gas introduction pipe according to any one of claims 20, 21, 24, 25, 26, 29, 30, 31, or 32, wherein a substrate material used for the source gas introduction pipe is made of SUS 304 or SUS 316 whose surface is polished or a material in which SUS 304 or SUS 316 is coated with hard gold plating film acid type bath including one of 99.7Au-0.3Co and 99.8Au-0.2Ni for surface treatment.

* * * * *